(12) United States Patent
Wakatsuchi

(10) Patent No.: US 10,741,927 B2
(45) Date of Patent: Aug. 11, 2020

(54) FILTER

(71) Applicant: NAGOYA INSTITUTE OF TECHNOLOGY, Nagoya-shi, Aichi (JP)

(72) Inventor: Hiroki Wakatsuchi, Nagoya (JP)

(73) Assignee: NAGOYA INSTITUTE OF TECHNOLOGY, Nagoya-shi (JP)

( * ) Notice: Subject to any disclaimer, the term of this patent is extended or adjusted under 35 U.S.C. 154(b) by 701 days.

(21) Appl. No.: 15/327,243

(22) PCT Filed: Jul. 15, 2015

(86) PCT No.: PCT/JP2015/070276
§ 371 (c)(1),
(2) Date: Jan. 18, 2017

(87) PCT Pub. No.: WO2016/013466
PCT Pub. Date: Jan. 28, 2016

(65) Prior Publication Data
US 2017/0201029 A1    Jul. 13, 2017

(30) Foreign Application Priority Data

Jul. 22, 2014 (JP) ................ 2014-148464
Jul. 30, 2014 (JP) ................ 2014-154363
Dec. 16, 2014 (JP) ................ 2014-253858

(51) Int. Cl.
*H01Q 15/14* (2006.01)
*H01Q 15/00* (2006.01)
(Continued)

(52) U.S. Cl.
CPC ........... *H01Q 15/0006* (2013.01); *G02B 5/20* (2013.01); *H01Q 15/008* (2013.01);
(Continued)

(58) Field of Classification Search
CPC .. H01Q 1/38; H01Q 15/0026; H01Q 15/0006; H01Q 3/46; H01Q 15/02
(Continued)

(56) References Cited

U.S. PATENT DOCUMENTS

2009/0105522 A1   4/2009  Yi et al.
2015/0028891 A1*  1/2015  Endo ................. G01R 27/02
                                                         324/649

FOREIGN PATENT DOCUMENTS

JP      S53-23248 A     3/1978
JP      S63-39207 A     2/1988
(Continued)

OTHER PUBLICATIONS

Hiroki Wakatsuchi et al; (Waveform-Dependent Absorbing Metasurfaces; Physical Review Letters 111; Dec. 10, 2013) (Year: 2013).*

(Continued)

*Primary Examiner* — Graham P Smith
(74) *Attorney, Agent, or Firm* — Oliff PLC

(57) ABSTRACT

A filter whose absorption rate for a radio wave changes depending on a waveform of a radio wave includes: a conductive member; a rectifier circuit that links two locations of the conductive member; and an RL circuit including an inductor and a resistor, the inductor generating an electromotive force using an electric current rectified by the rectifier circuit and the resistor converting the electric current to heat.

14 Claims, 17 Drawing Sheets

(51) Int. Cl.
*H03H 7/01* (2006.01)
*H05K 9/00* (2006.01)
*G02B 5/20* (2006.01)

(52) U.S. Cl.
CPC ......... *H01Q 15/0026* (2013.01); *H01Q 15/14* (2013.01); *H03H 7/01* (2013.01); *H05K 9/00* (2013.01)

(58) Field of Classification Search
USPC .................. 343/909, 700 MS, 745, 756, 783
See application file for complete search history.

(56) References Cited

FOREIGN PATENT DOCUMENTS

| | | |
|---|---|---|
| JP | H09-261009 A | 10/1997 |
| JP | 2007-184718 A | 7/2007 |
| JP | 2008-522572 A | 6/2008 |
| JP | 2013-030952 A | 2/2013 |

OTHER PUBLICATIONS

Feb. 8, 2018 Search Report issued in European Patent Application No. 15825141.3.

Daniel F. Sievenpiper; "Nonlinear Grounded Metasurfaces for Suppression of High-Power Pulsed RF Currents;" IEEE Antennas and Wireless Propagation Letters; vol. 10; Jan. 1, 2011; pp. 1516-1519; XP011403228.

Kim Sanghoon et al; "Nonlinear metamaterial surfaces for absorption of high power microwave surface currents;" 2013 IEEE Antennas and Propagation Society International Symposium; Jul. 7, 2013; pp. 2347-2348; XP032556749.

Hiroki Wakatsuchi et al; "Circuit-based nonlinear metasurface absorbers for high power surface currents;" Applied Physics Letters, A I P Publishing LLC; vol. 102; No. 21; May 27, 2013; pp. 214103-214103; XP012173241.

Allen M. Hawkes et al; "A microwave metamaterial with integrated power harvesting functionality;" Applied Physics Letters; vol. 103; No. 16; Oct. 14, 2013; p. 163901; XP055446716.

Aug. 11, 2015 International Search Report issued in International Patent Application No. PCT/JP2015/070276.

H. Wakatsuchi et al; "Experimental demonstration of nonlinear waveform-dependent metasurface absorber with pulsed signals;" Electronic Letters; Nov. 21, 2013; vol. 49; No. 24; pp. 1530-1531.

Hiroki Wakatsuchi et al; "Waveform-Dependent Absorbing Metasurfaces;" Physical Review Letters 111; Dec. 2013; 245501.

Jun. 4, 2019 Office Action issued in Japanese Patent Application No. 2016-535895.

* cited by examiner

FILTER

TECHNICAL FIELD

The present invention relates to a filter having electromagnetic characteristics capable of selectively absorbing and transmitting even radio waves of the same frequency correspondingly to a waveform of the radio wave.

BACKGROUND ART

A conventionally existing ordinary material provides no selectivity for radio waves of the same frequency in terms of a pulse width. As illustrated in FIG. 1A, the pulse width here signifies the length of a radio wave (pulse) per time unit during which the radio wave is generated. The pulse width also signifies a time length (excitation time) during which the radio wave energy is generated.

The resonance phenomenon of a periodic structure determines electromagnetic field characteristics in "a periodic structure shorter than an artificially designed incident radio wave wavelength" referred to as a metasurface. Appropriately designing the periodic structure can provide unusual electromagnetic field characteristics not found in the natural world.

The metasurface described in non-patent literatures 1 and 2 is structured to use full-wave rectification and periodically place a plurality of conductive materials having a conductive property in a lattice-like structure over a planar dielectric substance. Moreover, as illustrated in FIG. 24, a full-wave rectifier circuit 22 configured as a diode bridge links adjacent conductive materials 11. The full-wave rectifier circuit 22 includes an RC circuit 60 that connects a capacitor and a resistor in parallel. This circuit structure is placed where electric fields concentrate. Therefore, the RC circuit 60 is connected between the conductive materials 11 according to a conventional example.

A metasurface in FIG. 24 according to the conventional example is characterized to absorb a short-pulse radio wave and transmit a long-pulse radio wave even if the radio wave uses the same frequency. The operating principle is described below. The capacitor has an impedance expressed as $1/j\omega C$. In the expression, j denotes the imaginary unit, $\omega=2\pi f$ (where f is a frequency), and C denotes the capacitance.

The capacitor can store the high-frequency energy. However, the energy of low-frequency components fully charges the capacitor. The capacitor cannot store the energy any more. The energy stored in the capacitor is then discharged to the resistor. The short-pulse radio wave can therefore dissipate all the energy before the next radio wave arrives.

An incident wave induces a surface current and includes frequency component f in this example. However, rectifying action of the diode gradually converts the frequency component into a direct-current component.

From these viewpoints, the metasurface absorbs the radio wave with a short pulse width (excitation time or waveform) and transmits the radio wave with a long pulse width. Non-patent literatures 1 and 2 describe characteristics as illustrated in FIG. 25. In FIG. 25, the horizontal axis denotes a pulse width, the vertical axis denotes absorptance, a black square denotes a simulation result, and a white square denotes an experiment result.

The non-patent literatures describe that time constant $R_C C$ can control the characteristics. Specifically, varying newly specified time constant $R_C C$ can horizontally shift a curve in FIG. 25A to a curve in FIG. 25B. FIG. 25B entirely illustrates simulation results. A white circle uses the capacitance (i.e., time constant) ten times larger than a black square. A white triangle uses the capacitance (i.e., time constant) one tenth of a black square.

The developed waveform selectivity according to the conventional example is capable of changing ranges of pulse width absorbed by time constant. However, a shorter pulse always indicates a higher absorptance and a longer pulse or continuous wave always indicates a lower absorptance.

Therefore, the conventional example includes the following issue. The structure using the capacitor and the resistor cannot transmit a short pulse-width signal and absorb a long pulse. Accordingly, the structure cannot absorb or transmit only a signal with an optionally specified pulse width and transmit or absorb the other signals.

CITATION LIST

Non-Patent Literature

Non-Patent Literature 1: H. Wakatsuchi, J. J. Rushton, J. Lee, F. Gao, M. Jacob, S. Kim, D. F. Sievenpiper, "Experimental Demonstration of Nonlinear Waveform-Dependent Metasurface Absorber with Pulsed Signals", Electronics Letters, vol. 49, no. 24, pp. 1530-1531, November 2013.

Non-Patent Literature 2: H. Wakatsuchi, S. Kim, J. J. Rushton, D. Sievenpiper, "Waveform-Dependent Absorbing Metasurfaces", Physical Review Letters 111, 245501, December 2013.

SUMMARY OF INVENTION

Technical Problem

It is an object of the present invention to provide a filter at least part of whose pulse-width region is characterized to increase absorptance as a pulse width increases, or to provide a filter whose reflectance or transmittance decreases as a pulse width of a radio wave increases.

Solution to Problem

The inventors found that the configuration described below can solve the above-mentioned issue. Namely, the present invention provides the filter described below.

A filter according to a first aspect has absorptance for a radio wave that changes depending on a waveform of a radio wave. The filter includes: conductive materials; a rectifier circuit that links two locations of the conductive materials; and an RL circuit including an inductor and a resistor, the inductor generating an electromotive force using an electric current rectified by the rectifier circuit and the resistor converting the electric current to heat.

A filter according to a second aspect has absorptance for a radio wave that changes depending on a waveform of a radio wave. The filter includes: a conductive materials; a rectifier circuit that links two locations of the conductive materials; and an RL circuit that includes an inductor and a resistor connected serially and allows an electric current rectified by the rectifier circuit to flow.

The filter according to the first or second aspect enables at least part of pulse-width regions to provide characteristics in which increasing the pulse width increases the absorptance or provide characteristics in which reflectance or transmittance decreases as a pulse width of a radio wave increases.

DESCRIPTION OF EMBODIMENTS

Embodiments of the present invention will be described with reference to the accompanying drawings. The present invention is not limited to the embodiments described below and may be modified, corrected, or improved without departing from the spirit and scope of the invention.

Figure 1A:
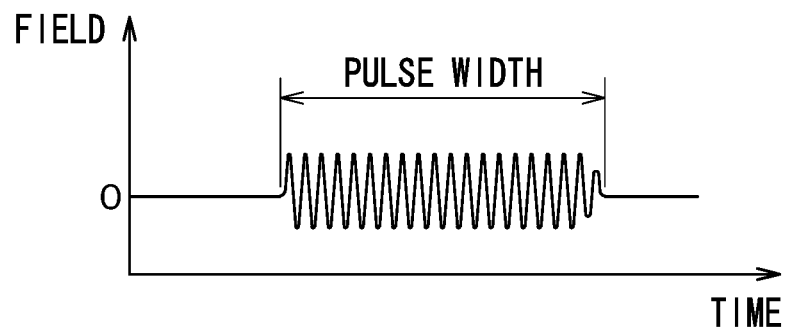
FIG. 1A illustrates the definition of a pulse width.

FIG. 1A defines a "pulse width" used in the present embodiments. The pulse width corresponds to a length of radio wave (pulse) per time unit during which the radio wave is generated. The pulse width also corresponds to the length of time during which the radio wave energy occurs continuously.

Figure 1B:
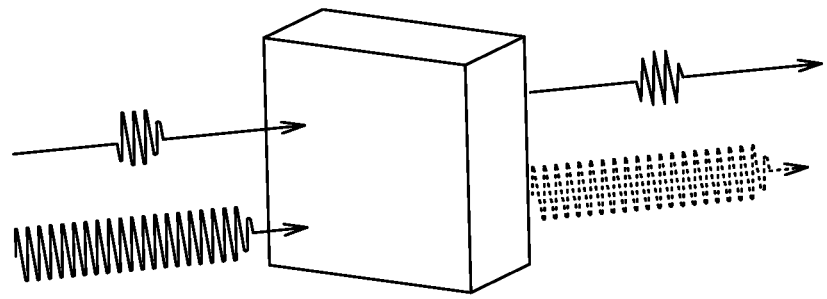
FIG. 1B is a diagram illustrating an embodiment of the concept of selective transmission dependent on a pulse width at the same frequency.

FIG. 1B illustrates selective transmission characteristics dependent on pulse widths at the same frequency in the waveform selection metasurface according to the present embodiment. FIG. 1B illustrates that the waveform selection metasurface (corresponding to a filter) according to the present embodiment can transmit a radio wave with a short pulse width and absorb a radio wave with a long pulse width when the radio waves use the same frequency. Therefore, the waveform selection metasurface is provided as a waveform selection filter and also as an electromagnetic field material including the filter function.

Figure 2:
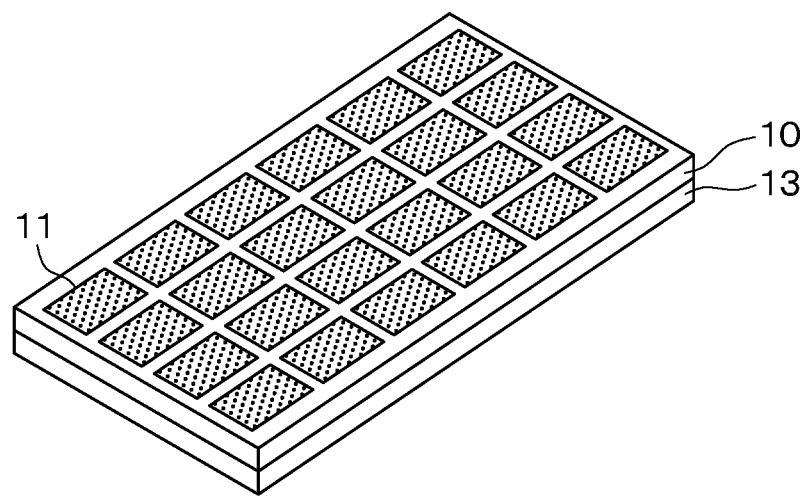
FIG. 2 is a diagram illustrating an overall structure of a waveform selection metasurface.

FIG. 2 illustrates an overall structure of the waveform selection metasurface. The waveform selection metasurface uses a basic planar shape. A dielectric substance 10 is placed on a metal plate 13. A plurality of conductive materials 11 are placed on the dielectric substance 10.

Figure 3A:
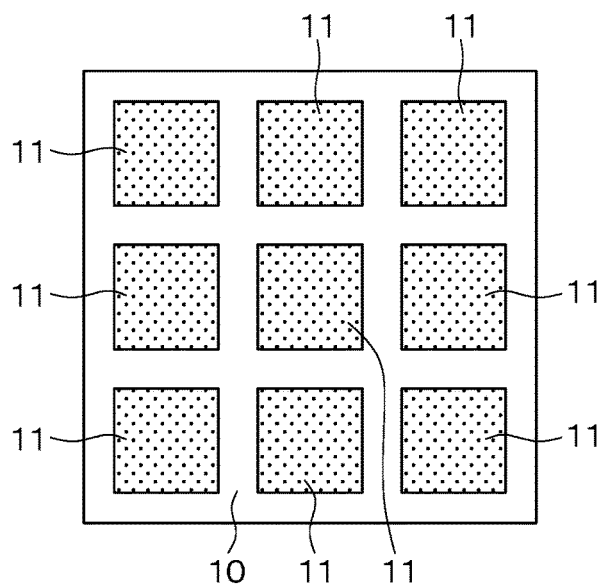
FIG. 3A is a diagram illustrating a pattern example of placing conductive materials on a dielectric substance.
Figure 3B:
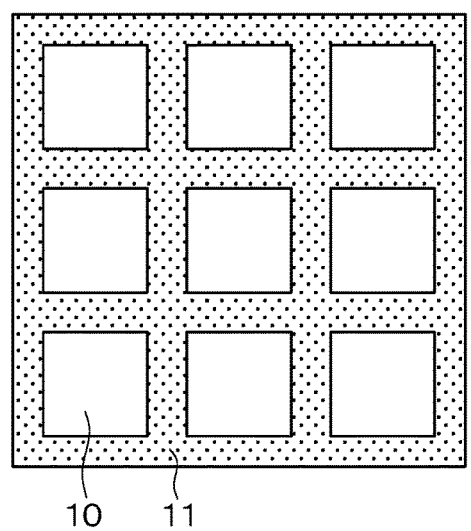
FIG. 3B is a diagram illustrating a pattern example of placing conductive materials on a dielectric substance.
Figure 3C:
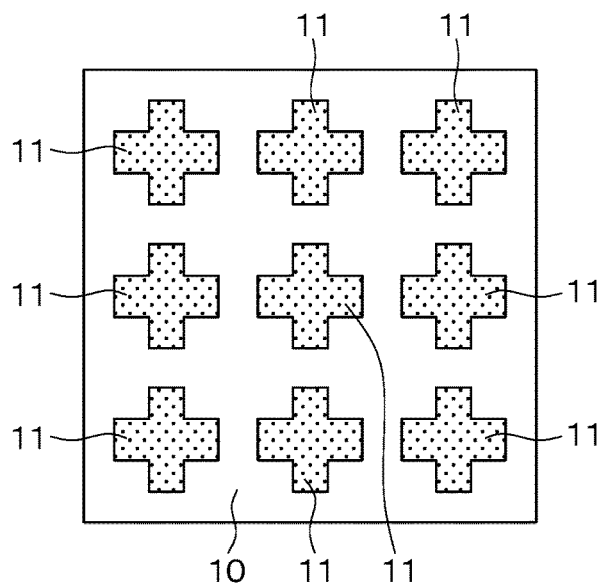
FIG. 3C is a diagram illustrating a pattern example of placing conductive materials on a dielectric substance.

FIGS. 3A, 3B, and 3C illustrate examples of cyclic placement of the conductive materials 11 on the dielectric substance 10 while there are variations of placements. FIG. 3A illustrates an example of placing a plurality of quadrangular conductive materials 11 (e.g., each as a square approximately 18 mm on a side) in the form of a cyclic two-dimensional square lattice (i.e., matrix) on one quadrangular (or square to be more specific) dielectric substance 10.

FIG. 3B illustrates an example of placing one lattice-shaped conductive materials 11 including a plurality of quadrangular holes in the form of a two-dimensional square lattice (i.e., matrix) on one quadrangular (or square to be more specific) dielectric substance 10. In this case, an RL circuit 30 and/or an RC circuit 40 (added to the RL circuit 30 in parallel or in series) is placed inside the dielectric substance 10.

FIG. 3C illustrates an example of changing the shape of the conductive materials 11 according to the example in FIG. 3A to a cross shape. Shapes of the conductive materials 11 are not limited to the examples in FIGS. 3A through 3C and can be variously modified on condition that the cyclic placement is available. The waveform selection metasurface can be shaped to be planar or flat by separating and periodically placing the conductive materials. The planar or flat shape enables the waveform selection metasurface to function as an antenna capable of efficiently receiving a radio wave. The waveform selection metasurface can be configured to be layered on an existing antenna.

Figure 4A:
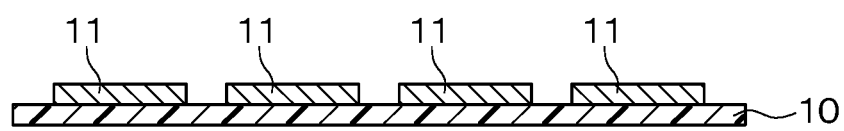
FIG. 4A is a diagram illustrating a cross-sectional structure of the waveform selection metasurface.
Figure 4B:
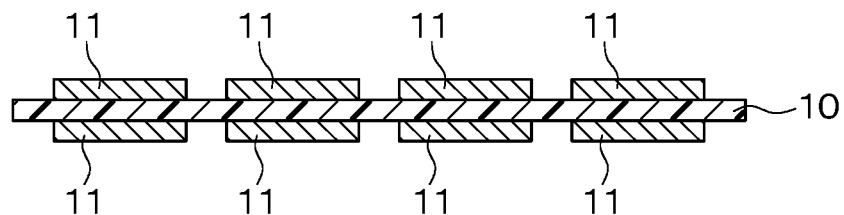
FIG. 4B is a diagram illustrating a cross-sectional structure of the waveform selection metasurface.
Figure 4C:
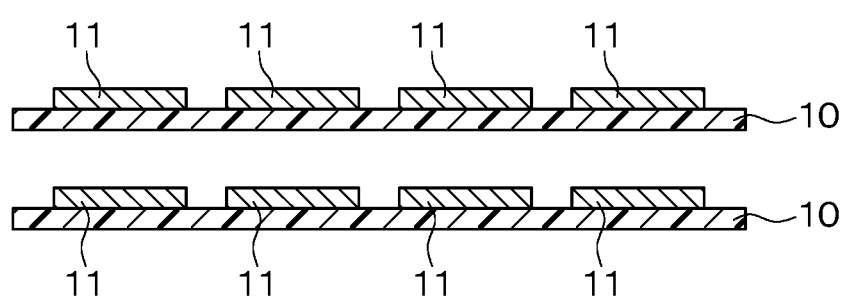
FIG. 4C is a diagram illustrating a cross-sectional structure of the waveform selection metasurface.

FIGS. 4A, 4B, and 4C illustrate variations of cross-section structures of the waveform selection metasurface. FIG. 4A illustrates a basic structure of placing the conductive materials 11 on the dielectric substance 10. FIG. 4B illustrates a structure of placing the conductive materials 11 on each of top and bottom surfaces of the dielectric substance 10. FIG. 4C illustrates a structure of layering the basic structure in FIG. 4A. Any of the cross-section structures in FIGS. 4A, 4B, and 4C can be combined with any of the placements in FIGS. 3A, 3B, and 3C.

Figure 5A:
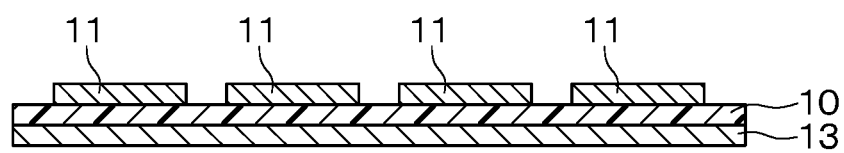
FIG. 5A is a diagram illustrating a cross-sectional structure of the waveform selection metasurface lined with a metal plate.
Figure 5B:
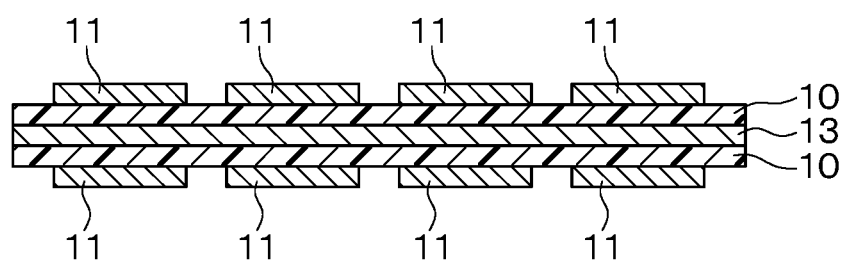
FIG. 5B is a diagram illustrating a cross-sectional structure of the waveform selection metasurface lined with a metal plate.

A plurality of layers as illustrated in FIG. 4B or 4C can improve or fine-tune a selective absorptance. FIGS. 5A and 5B illustrate further variations of the cross-section structure of the waveform selection metasurface that includes the dielectric substance 10 lined with the metal plate 13.

FIG. 5A illustrates a basic structure of layering the dielectric substance 10 on the metal plate 13 and placing the conductive materials 11 on the dielectric substance 10. FIG. 5B illustrates a structure of layering one dielectric substance 10 on each of the top and bottom surfaces of the metal plate 13 and placing the conductive materials 11 on each of the two dielectric substances 10. Lining the dielectric substance 10 with the metal plate 13 can provide the selective absorptance for not only a radio wave in the free space, but also a surface current that results from a radio wave propagating over the metal plate surface in the horizontal direction in FIGS. 5A and 5B and propagates in the same direction.

As illustrated in FIG. 5B, placing the dielectric substance 10 and the conductive materials 11 on both sides of the metal plate can provide the selective absorptance for both sides.

Any of the cross-section structures in FIGS. 5A, and 5B can be combined with any of the placements in FIGS. 3A, 3B, and 3C.

Figure 6A:
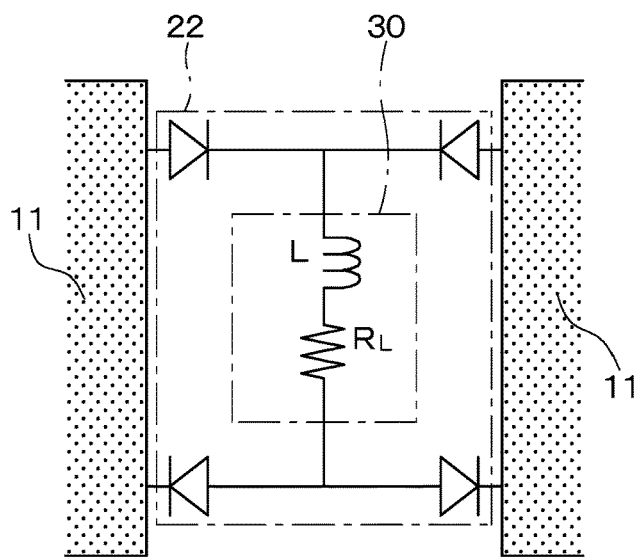
FIG. 6A is a diagram illustrating the waveform selection metasurface including an RL circuit 30 connected to a full-wave rectifier circuit 22 according to a first embodiment.

As illustrated in FIGS. 3A through 3C, 4A through 4C, 5A, or 5B, the conductive materials 11 are periodically placed to leave an interval therebetween and are electrically connected via the structure of a full-wave rectifier circuit 22 as illustrated in FIG. 6A. A diode bridge is used here as an example of this waveform selection metasurface. The full-wave rectification is also available by replacing the diode bridge with a rectifier circuit element or a rectifier circuit structure such an ideal diode using a transistor or an operational amplifier.

First Embodiment

Figure 6B:
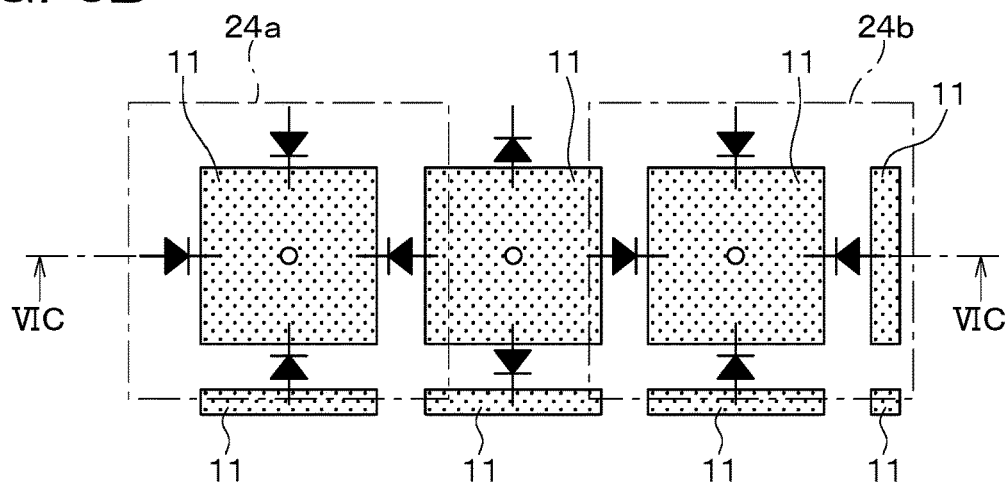
FIG. 6B is a plan view illustrating the waveform selection metasurface including the RL circuit 30 connected to half-wave rectifier circuits 24a and 24b according to the first embodiment.

FIGS. 6A and 6B illustrate waveform selection metasurfaces according to the first embodiment in which the RL circuit 30 is connected to a rectifier circuit. FIG. 6A uses the full-wave rectifier circuit 22 as the rectifier circuit. As illustrated in FIG. 6A, the full-wave rectifier circuit 22 is formed as the rectifier circuit on electric wiring (connection circuit) between the adjacent conductive materials 11. The RL circuit 30 includes serially connected inductor L and resistor $R_L$ and is connected in the full-wave rectifier circuit 22. As above, this full-wave rectifier circuit 22 can be replaced by not only the diode bridge, but also the other full-wave rectifier circuits. For example, an ideal diode using a transistor or an operational amplifier can be used to provide a comparable effect.

Inductor L is connected to the full-wave rectifier circuit 22 and is therefore free from characteristic degradation due to a high-frequency signal.

Figure 6C:
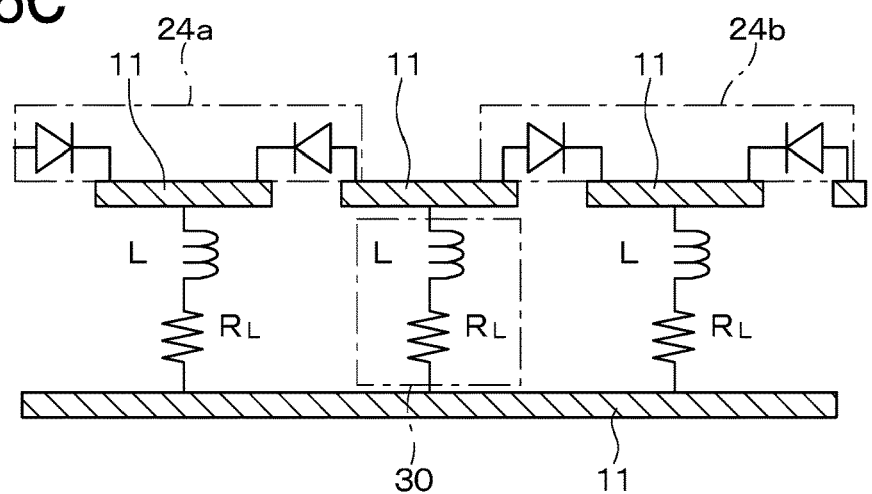
FIG. 6C is a cross-sectional view taken along the line VIC-VIC of FIG. 6B.

FIGS. 6B and 6C illustrate a waveform selection metasurface that uses half-wave rectifier circuits 24a and 24b as rectifier circuits. FIG. 6B is a plan view of the waveform selection metasurface. FIG. 6C is a cross-sectional view taken along the line VIC-VIC of FIG. 6B. A half-wave rectifier circuit 24a and a half-wave rectifier circuit 24b are alternately formed as rectifier circuits on electric wiring (connection circuit) between the adjacent conductive materials 11 at the topmost part in FIG. 6C. The half-wave rectifier circuit 24a prevents a current from flowing from the conductive materials 11. The half-wave rectifier circuit 24b prevents a current from entering the conductive materials 11. Inductor L and resistor $R_L$ are connected to the half-wave rectifier circuits 24a and 24b in series. Inductor L and resistor $R_L$ configure the RL circuit 30

Though not shown, the dielectric substance 10 can be variously placed as illustrated in FIGS. 3A through 3C, 4A through 4C, 5A, and 5B on any of the waveform selection metasurfaces in FIGS. 6A, 6B, and 6C.

As above, the waveform selection metasurface according to the first embodiment is configured by periodically placing the conductive materials 11 on the dielectric substance 10. The metasurface (filter) includes the conductive materials 11 of which the adjacent conductive materials 11 are wired by the rectifier circuit. The rectifier circuit is connected with the RL circuit 30 that includes inductor L and resistor $R_L$. Inductor L generates an electromotive force using a current flowing from one conductive materials 11 to the other. Resistor $R_L$ converts the current to the heat. The full-wave rectifier circuit 22 is configured by alternately placing the full-wave rectifier circuit 22 or the half-wave rectifier circuit 24a or 24b.

The waveform selection metasurface according to the first embodiment illustrated in FIGS. 6A through 6C is characterized to transmit a short-pulse radio wave and absorb a long-pulse radio wave even if the radio wave uses the same frequency.

The operating principle will be described below. Inductor L of the RL circuit 30 has the impedance expressed as jωL. In the expression: j denotes an imaginary unit; ω=2πf (f is a frequency); and L denotes an inductance.

The effect of inductance L transmits a low-frequency signal. However, a high-frequency component generates an electromotive force and is eliminated. Resistor $R_L$ consumes the energy of a current that passes through the inductor.

An incident wave induces a current over the surface of the conductive materials. The incident wave and the induced current are assumed to have frequency component f. A rectifying action of the diode gradually converts the frequency component to a direct-current component. Therefore, a long pulse weakens the electromotive force of the inductor. The resistor dissipates the energy.

Based on these considerations, the waveform selection metasurface absorbs the radio wave with a sufficiently long pulse width and transmits the radio wave with a short pulse width. These characteristics can be controlled by time constant $L/R_L$, where L denotes an inductance of the inductor and $R_L$ denotes a resistor value of the resistor.

Figure 7:
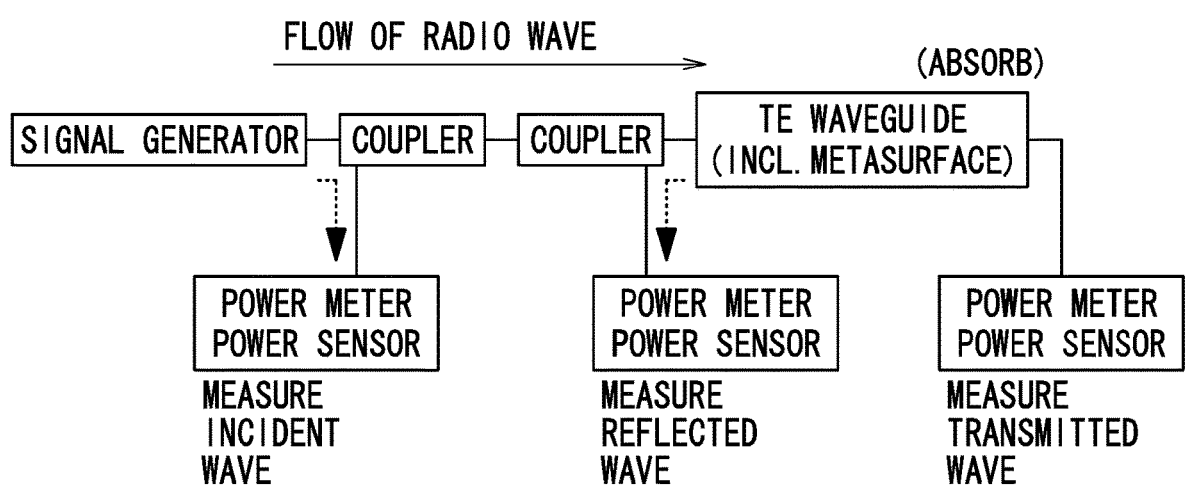
FIG. 7 illustrates an experimental apparatus that measures absorptance of the waveform selection metasurface with reference to a pulse width.

FIG. 7 illustrates an experimental apparatus that measures absorptance of the waveform selection metasurface with reference to a pulse width. The experiment using the experimental apparatus allows a signal generator to generate a sinusoidal pulse wave. A power meter or a power sensor attached to a coupler measures energy $E_i$ of the incident wave. Energy $E_r$ of a reflected wave is also measured similarly.

The waveform selection metasurface is placed at the bottom in a TE waveguide and absorbs or transmits a surface current induced by the incident wave. Therefore, energy $E_t$ of the transmitted wave is measured after passing through the TE waveguide. Absorptance A is thus calculated from the equation of $A=1-(E_r+E_t)/E_i$.

Figure 8A:
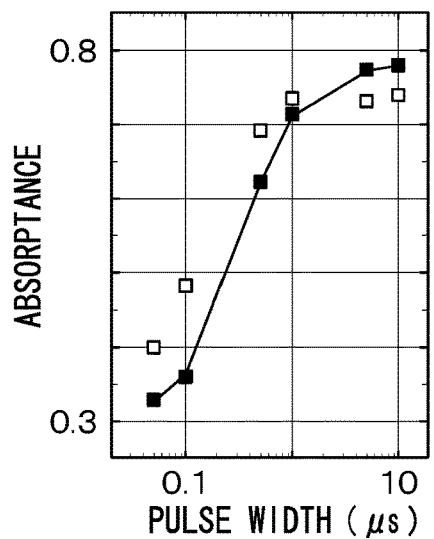
FIG. 8A is a graph illustrating a result of simulating and experimenting absorptance with reference to a pulse width using a single time constant.

FIG. 8A illustrates a result of simulating and experimenting absorptance with reference to a pulse width to demonstrate the effect of the first embodiment. The simulation is performed under the same condition as the experiment. The black square denotes a simulation result. The white square denotes an experiment result. The short pulse width decreases the absorptance. The long pulse width increases the absorptance.

In the simulation and the experiment, inductor L has an inductance of 100 pH and resistor $R_L$ has a resistor value of 5.5 ohms. The radio wave frequency is set to 4.2 GHz for all simulations including this result and to 4.0 GHz for the experiment.

Different frequencies (also referred to as operating frequencies) can be used to operate a radio wave capable of providing the effect of absorption for the waveform selection metasurface by changing a size (the 18-mm square in this example) or an interval of the periodic structure of the metal (conductive materials 11) on the dielectric substance.

Figure 8B:
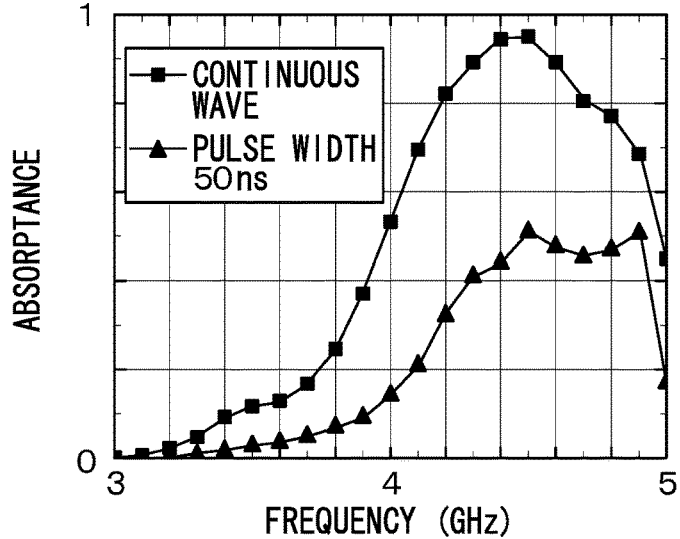
FIG. 8B is a graph illustrating a result of simulating absorptance with reference to a frequency.

For example, the simulation in FIG. 8A changes the radio wave frequency from 3 GHz to 5 GHz while the radio wave pulse width is fixed to 50 ns. Absorptances are then indicated by black triangles in FIG. 8B. A black square used for the simulation in FIG. 8B indicates absorptance when the radio wave is assumed to be a continuous wave, not a pulse.

The frequency range capable of providing the waveform selectivity most largely depends on a range to operate the full-wave rectifier circuit 22. Even a high frequency such as 20 GHz enables operation when a GaAs (gallium arsenide) diode is used, for example.

Figure 8C:
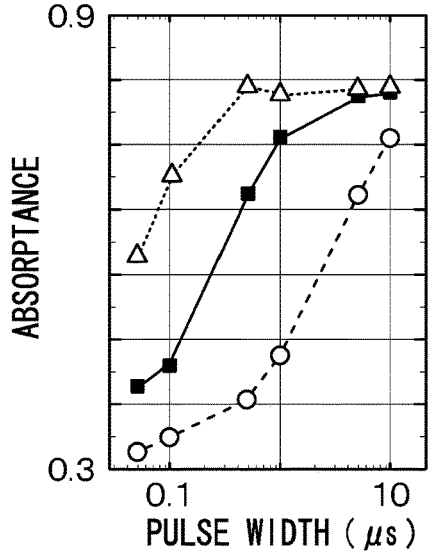
FIG. 8C is a graph illustrating a result of simulating and experimenting absorptance with reference to a pulse width using a plurality of time constants.

In FIG. 8C, a white circle represents a result of increasing the inductance up to ten times and a white triangle represents a result of decreasing the inductance down to one tenth in relation to the simulation in FIG. 8A (black squares in FIG. 8C). A short pulse width causes a small absorptance. A long pulse width causes a large absorptance. Decreasing the inductance increases absorptance A.

As above, the RL circuit 30 can provide the waveform selection metasurface that is characterized to minimize the absorptance corresponding to a short pulse width and maximize the absorptance corresponding to a long pulse width. Varying the time constant of the RL circuit 30 can vary the characteristics of the waveform selection metasurface that is characterized to minimize the absorptance corresponding to a short pulse width and maximize the absorptance corresponding to a long pulse width.

Second Embodiment

Figure 9A:
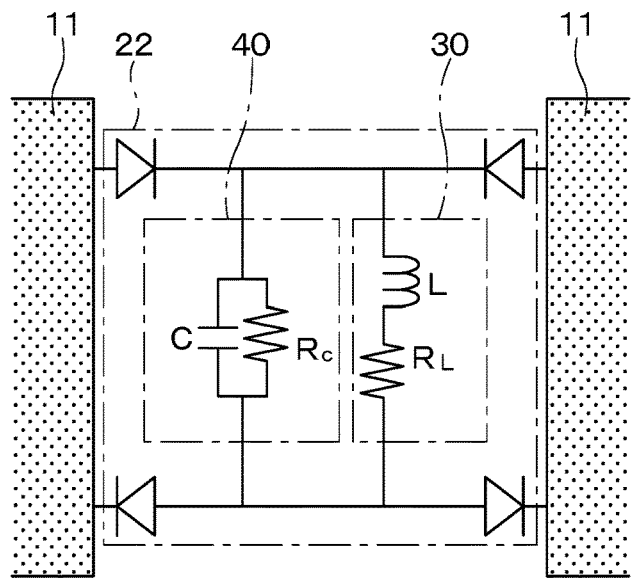
FIG. 9A is a circuit configuration diagram illustrating a waveform selection metasurface using full-wave rectification according to a second embodiment.
Figure 9B:
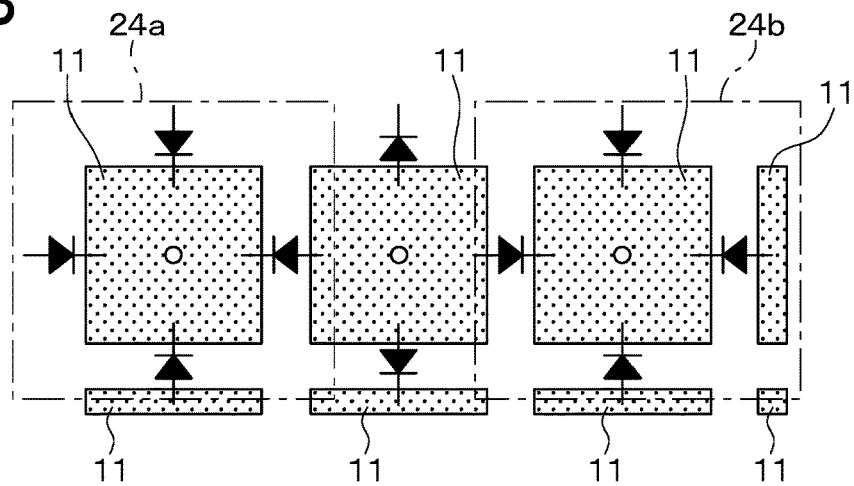
FIG. 9B is a configuration diagram illustrating placement of a waveform selection metasurface using half-wave rectification according to the second embodiment.
Figure 9C:
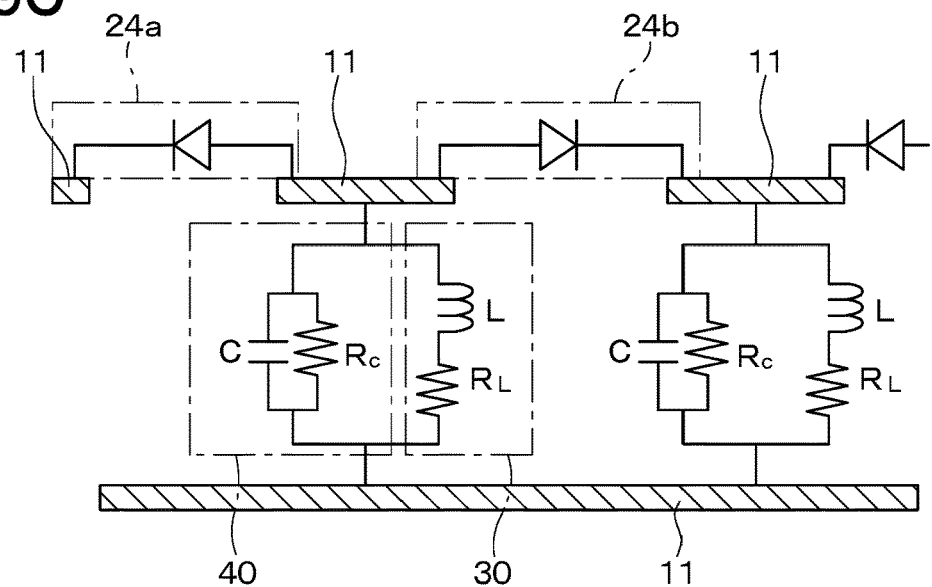
FIG. 9C is a circuit configuration diagram illustrating the waveform selection metasurface using half-wave rectification according to the second embodiment.

FIGS. 9A, 9B, and 9C illustrate rectifier circuits according to the second embodiment including the RL circuit 30 and the RC circuit 40 connected to each other in parallel. The RL circuit 30 includes inductor L and resistor R connected in series. The RC circuit 40 includes capacitor C and resistor R connected in parallel.

FIG. 9A is a circuit configuration diagram illustrating a waveform selection metasurface using full-wave rectification. The waveform selection metasurface includes the full-wave rectifier circuit 22 that is formed as a rectifier circuit on electric wiring (connection circuit) between the adjacent conductive materials 11. The full-wave rectifier circuit 22 includes the RL circuit 30 and the RC circuit 40 connected to each other in parallel. The RL circuit 30 includes inductor L and resistor $R_L$ connected in series. The RC circuit 40 includes capacitor C and resistor $R_C$ connected in parallel. Inductor L is connected to the full-wave rectifier circuit 22 and is therefore free from characteristic degradation due to a high-frequency signal.

FIGS. 9B and 9C are a configuration diagram and a circuit configuration diagram illustrating placement of a waveform selection metasurface using half-wave rectification. The half-wave rectifier circuits 24a and 24b are alternately formed as rectifier circuits on electric wiring (connection circuit) between the adjacent conductive materials 11 at the topmost part. The half-wave rectifier circuits 24a and 24b connect with the RC circuit 40 in parallel to the RL circuit 30.

The second embodiment can allow the circuit using capacitor C to absorb a short pulse only a small amount of which can be absorbed in the first embodiment. An intermediate pulse-width signal not absorbed in both circuit structures can be transmitted.

Circuit characteristics of the RC circuit 40 can be controlled by time constant $R_C C$, where C denotes the capacitance of a capacitor and $R_C$ denotes the resistor value of a resistor used with the capacitor in pairs. Characteristics of a circuit structure for inductance can be also controlled by time constant $L/R_L$. It is therefore possible to transmit any specified waveform and absorb the other signals.

The second embodiment therefore periodically places the conductive materials 11 on the dielectric substance 10. The metasurface includes the conductive materials 11 of which the adjacent conductive materials 11 are wired by the rectifier circuit. The RL circuit 30 and the RC circuit 40 are connected in parallel inside the rectifier circuit. The full-wave rectifier circuit 22 is configured by alternately placing the full-wave rectifier circuit 22 or the half-wave rectifier circuit 24a or 24b.

Though not shown, the dielectric substance 10 can be variously placed as illustrated in FIGS. 3A through 3C, 4A through 4C, 5A, and 5B on any of the waveform selection metasurfaces in FIGS. 9A, 9B, and 9C.

Figure 10A:
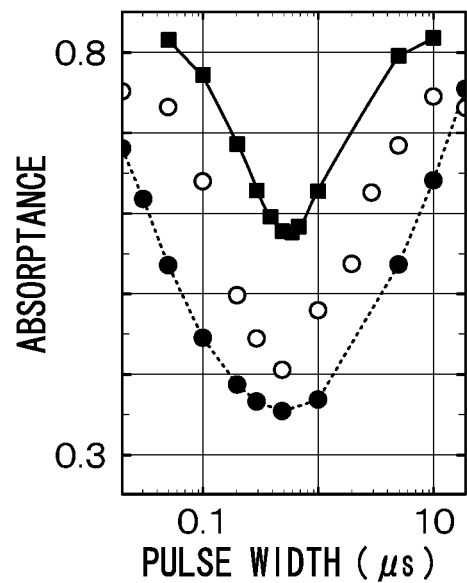
FIG. 10A is a diagram illustrating a result of simulating and experimenting absorptance with reference to a pulse width according to the second embodiment.

FIG. 10A illustrates a result of simulating and experimenting absorptance with reference to a pulse width according to the second embodiment. In FIG. 10A, a black square and a black circle indicate results of simulation using different time constants. A white circle indicates a result of an experiment under the same condition as the simulation indicated by the black circle. The simulation indicated by the black square uses a larger capacitance and a smaller inductance than the simulation indicated by the black circle. The simulation indicated by the black circle uses a smaller capacitance and a larger inductance than the simulation indicated by the black square.

More specifically, the simulation indicated by the black square uses C, L, $R_C$, and $R_L$ that correspond to 1 nF, 100 µH, 10 kΩ, and 5.5Ω, respectively. The simulation indicated by the black circle and the experiment indicated by the white circle use C, L, $R_C$, and $R_L$ that correspond to 100 pF, 1 mH, 10 kΩ, and 31.2Ω, respectively. The other conditions for the simulation and the experiment are equal to those used in FIGS. 8A through 8C.

The experiments and the simulations reveal characteristics in which the absorptance is maximized in response to a long pulse width and a short pulse width and the absorptance is minimized in response to an intermediate pulse width between the long pulse width and the short pulse width.

Figure 25A:
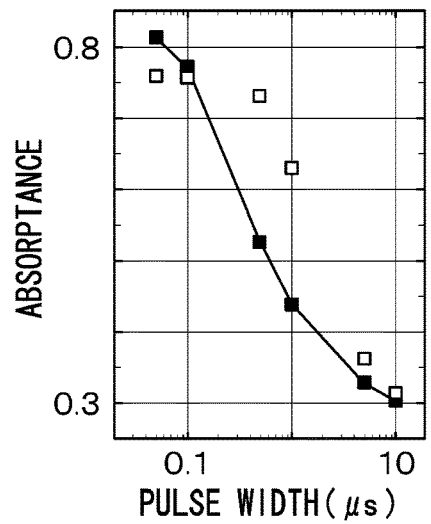
FIG. 25A is a diagram illustrating a result of simulating and experimenting an v with reference to a pulse width as an effect of the conventional example.
Figure 25B:
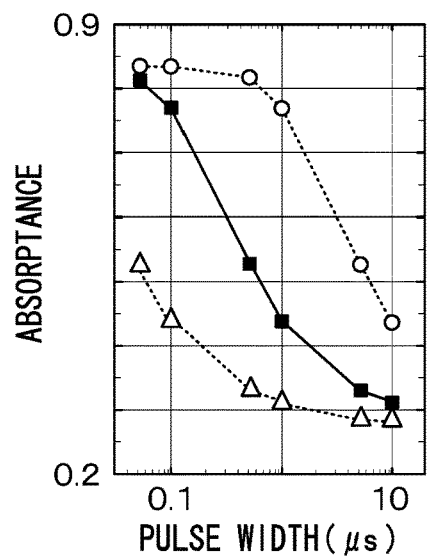
FIG. 25B is a diagram illustrating a result of simulating and experimenting absorptance with reference to a pulse width as an effect of the conventional example.

Namely, the black circle signifies a combination of the circuit using a small time constant (e.g., represented by the white triangle compared to the black square) in FIG. 25B and the circuit using a large time constant (e.g., represented by the white circle compared to the black square) in FIG. 8C.

The present embodiment connects the RL circuit 30 and the RC circuit 40 in parallel and therefore implements a pulse width corresponding to a higher absorptance out of pulse widths according to the graphs in FIGS. 25B and 8C. The result is to implement the absorptance as illustrated in FIG. 10A.

The simulation result and the experiment result in FIG. 10A demonstrate that a specified pulse-width signal can be experimentally transmitted despite differences due to a parasitic parameter of a circuit used or direct-current superposition characteristics of the inductor.

Figure 10B:
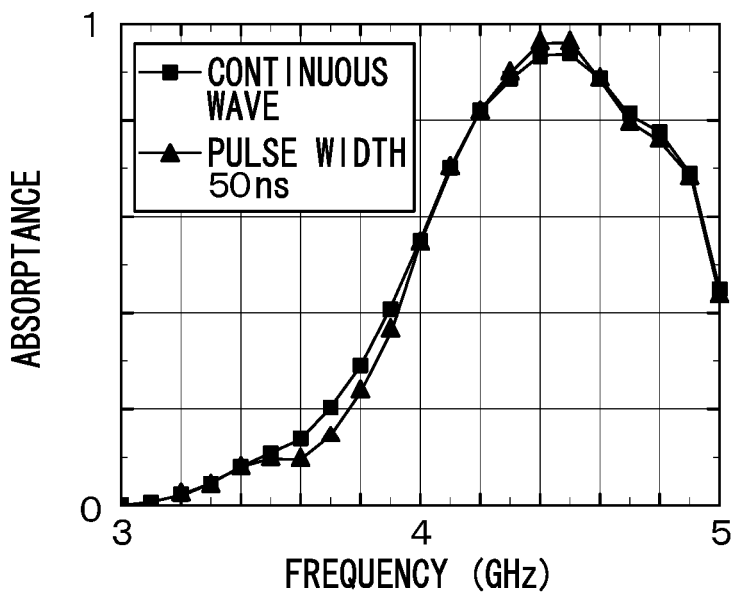
FIG. 10B is a graph illustrating a result of simulating absorptance with reference to a frequency according to the second embodiment.

The simulation in FIG. 10A changes the radio wave frequency from 3 GHz to 5 GHz while the radio wave pulse width is fixed to 50 ns. Absorptances are then indicated by black triangles in FIG. 10B. A black square used for the simulation in FIG. 10B indicates absorptance when the radio wave is assumed to be a continuous wave, not a pulse.

As above, the RL circuit 30 and the RC circuit 40 are connected in parallel. The waveform selection metasurface (corresponding to a filter) is then available to indicate characteristics in which the absorptance is maximized in response to a long pulse width and a short pulse width and the absorptance is minimized in response to a pulse width between the long pulse width and the short pulse width. The pulse width can be set to an intended value so as to maximize the absorptance by varying the time constant for the RL circuit 30 and/or the RC circuit 40.

Third Embodiment

Figure 11A:
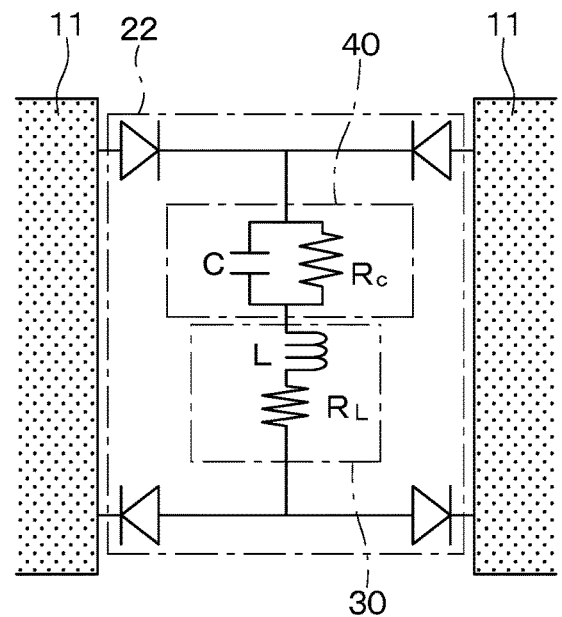
FIG. 11A is a circuit configuration diagram illustrating a waveform selection metasurface using full-wave rectification according to a third embodiment.
Figure 11B:
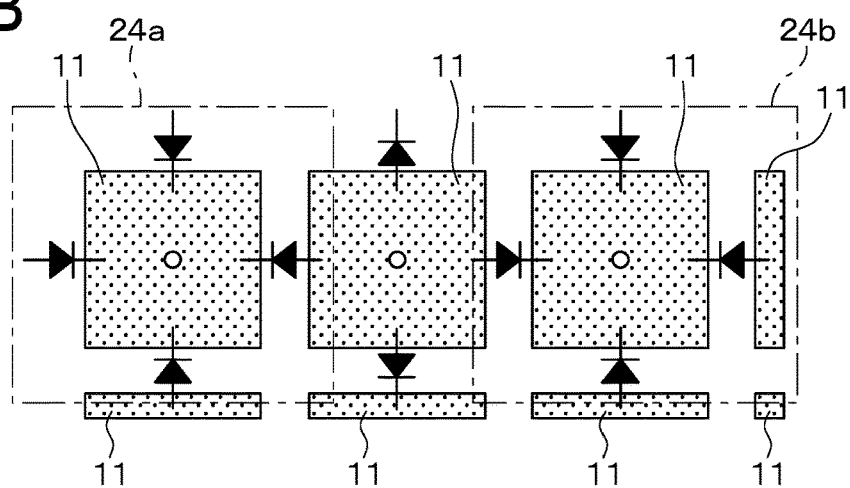
FIG. 11B is a configuration diagram illustrating placement of a waveform selection metasurface using half-wave rectification according to the third embodiment.
Figure 11C:
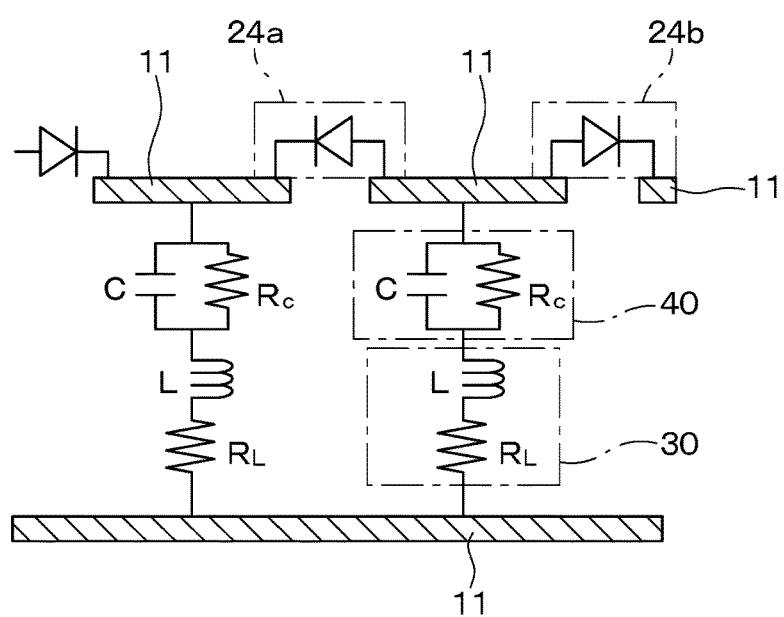
FIG. 11C is a circuit configuration diagram illustrating the waveform selection metasurface using half-wave rectification according to the third embodiment.

FIGS. 11A, 11B, and 11C illustrate waveform selection metasurfaces using rectifier circuits according to the third embodiment that are connected to the RL circuit 30 and the RC circuit 40 in series. The RL circuit 30 includes serially connected inductor L and resistor $R_L$. The RC circuit 40 includes capacitor C and resistor $R_C$ that are connected in parallel.

FIG. 11A is a circuit configuration diagram illustrating the waveform selection metasurface using full-wave rectification. This waveform selection metasurface forms the full-wave rectifier circuit 22 as a rectifier circuit on the electric wiring (connection circuit) between the adjacent conductive materials 11. The full-wave rectifier circuit 22 includes the RL circuit 30 and the RC circuit 40 that are connected in series. The RL circuit 30 includes serially connected inductor L and resistor $R_L$. The RC circuit 40 includes capacitor C and resistor $R_C$ that are connected in parallel. The inductor is connected to the full-wave rectifier circuit 22 and is therefore free from characteristic degradation due to a high-frequency signal.

FIGS. 11B and 11C are a configuration diagram and a circuit configuration diagram illustrating placement of the waveform selection metasurface using half-wave rectification. This waveform selection metasurface includes the half-wave rectifier circuits 24a and 24b that are alternately formed as rectifier circuits on the electric wiring (connection circuit) between the adjacent conductive materials 11 at the topmost part. The RL circuit 30 is connected to the half-wave rectifier circuits 24a and 24b. The RC circuit 40 is connected to the RL circuit 30 in series.

According to the third embodiment, the circuit using the capacitor can transmit a long pulse that is absorbed in the first embodiment. The circuit can absorb an intermediate pulse-width signal that is not transmitted in both circuit structures.

Circuit characteristics of the capacitor in the RC circuit 40 can be controlled by time constant $R_C C$, where C denotes the capacitance of the capacitor and $R_C$ denotes the resistor value of a resistor used in pairs. Characteristics of the circuit structure of the RL circuit 30 can also be controlled by time constant $L/R_1$. It is therefore possible to transmit any specified waveform and absorb the other signals by independently adjusting these two time constants.

Figure 12A:
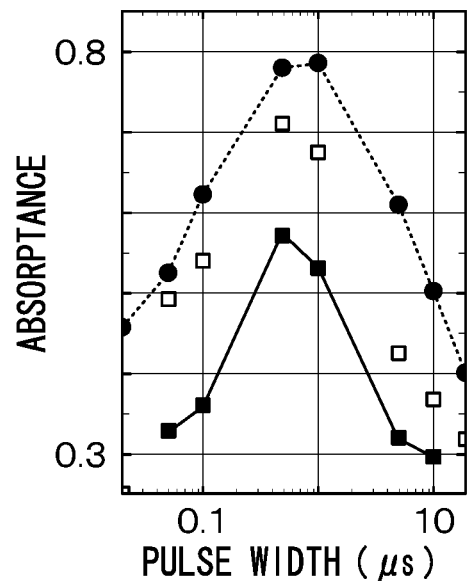
FIG. 12A illustrates a result of simulating and experimenting absorptance with reference to a pulse width according to the third embodiment.

FIG. 12A illustrates a result of simulating and experimenting absorptance with reference to a pulse width according to the third embodiment. A black square and a black circle indicate results of simulation using different time constants. A white square indicates an experiment result corresponding to the black square. The black square uses a relatively small capacitance and a relatively large inductance. The black circle uses a relatively large capacitance and a relatively small inductance.

More specifically, the simulation indicated by the black square uses C, L, $R_C$, and $R_L$ that correspond to 1 nF, 100 µH, 10 kΩ, and 5.5Ω, respectively. The simulation indicated by the black circle and the experiment indicated by the white circle use C, L, $R_C$, and $R_L$ that correspond to 10 nF, 10 µH, 10 kΩ, and 2Ω, respectively. The other conditions for the simulation and the experiment are equal to those used in FIGS. 8A through 8C.

The experiments and the simulations reveal characteristics in which the absorptance is minimized in response to a long pulse width and a short pulse width and the absorptance is maximized in response to an intermediate pulse width between the long pulse and the short pulse width. Namely, the black circle signifies a combination of the circuit using a large time constant (e.g., represented by the white circle compared to the black square) in FIG. 25B and the circuit using a small time constant (e.g., represented by the white triangle compared to the black square) in FIG. 8C.

The present embodiment connects the RL circuit 30 and the RC circuit 40 in series and therefore implements a pulse width corresponding to a lower absorptance out of pulse widths according to the graphs in FIGS. 25B and 8C. The result is to implement the absorptance as illustrated in FIG. 12A.

The simulation result and the experiment result in FIG. 12A demonstrate that a specified pulse-width signal can be experimentally absorbed despite differences due to a parasitic parameter of a circuit used or direct-current superposition characteristics of the inductor.

Figure 12B:
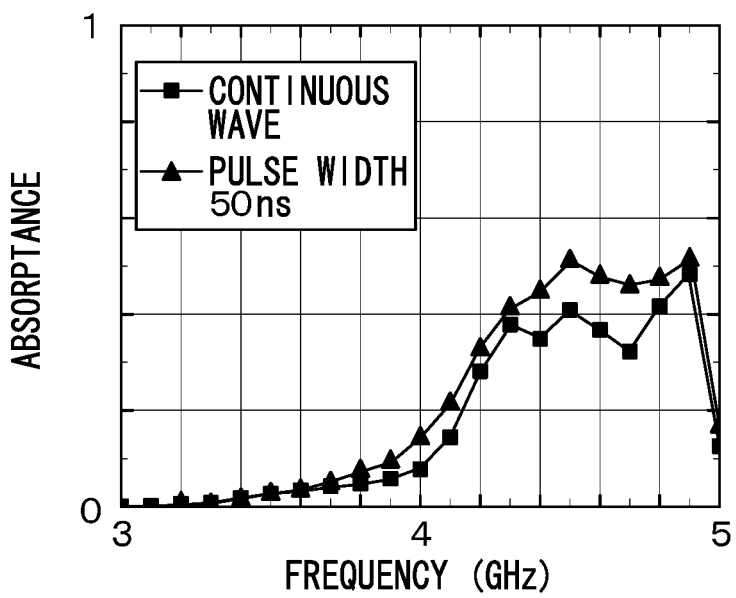
FIG. 12B is a graph illustrating a result of simulating absorptance with reference to a frequency according to the third embodiment.

The simulation in FIG. 12A changes the radio wave frequency from 3 GHz to 5 GHz while the radio wave pulse width is fixed to 50 ns. Absorptances are then indicated by black triangles in FIG. 12B. A black square used for the simulation in FIG. 12B indicates absorptance when the radio wave is assumed to be a continuous wave, not a pulse.

Varying the time constant for the RL circuit 30 and/or the RC circuit 40 can provide the waveform selection metasurface (corresponding to a filter) indicating characteristics in which the absorptance is minimized in response to a long pulse width and a short pulse width and the absorptance is maximized in response to a pulse width between the long pulse width and the short pulse width.

Transmission Characteristics in the Time Domain

Figure 13:
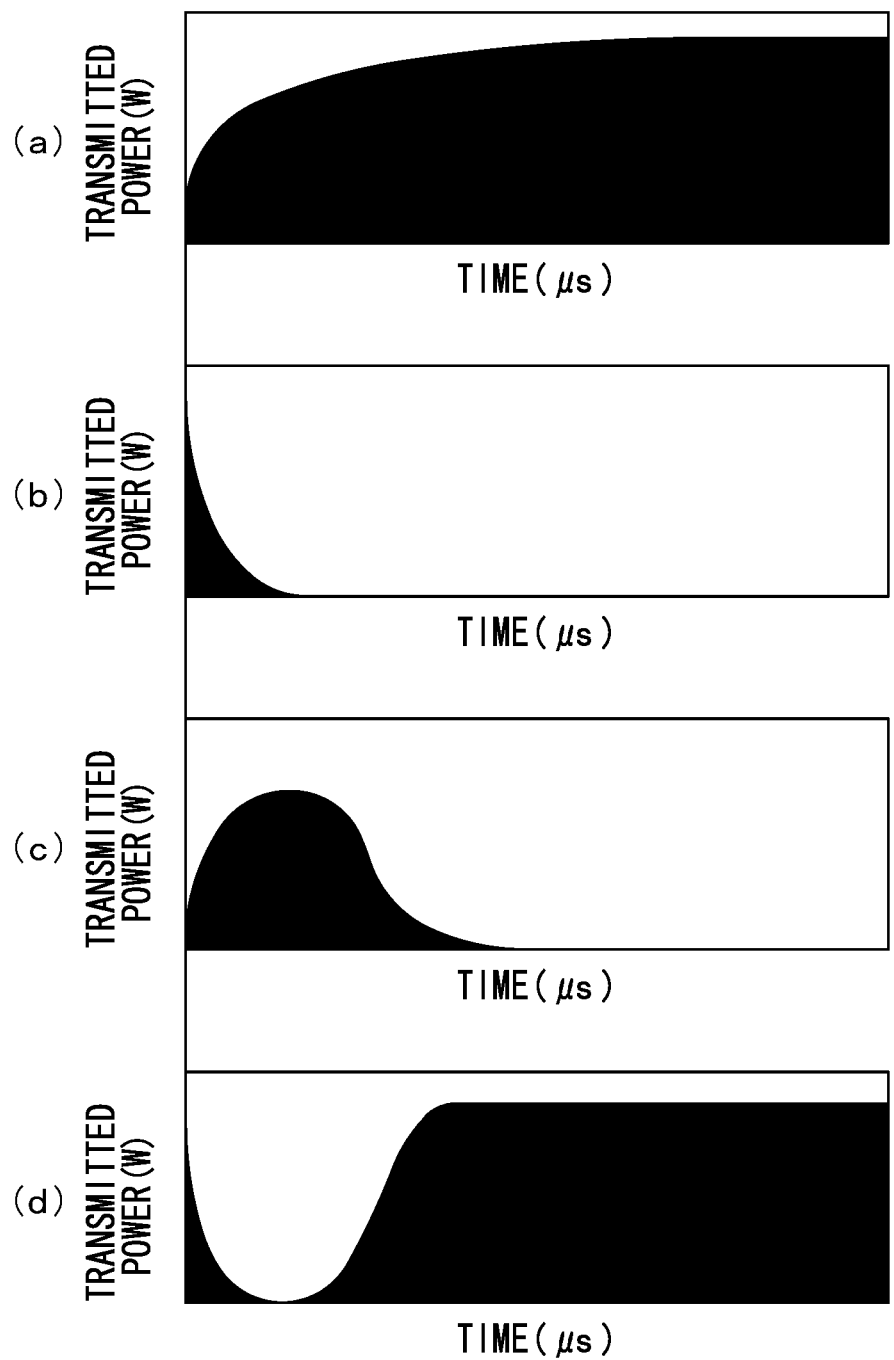
FIG. 13 is a diagram simply illustrating a transmitted wave in a time domain when a continuous wave (surface wave) is irradiated to the metasurface.

FIG. 13 is a diagram simply illustrating states of a transmitted wave in the time domain when a continuous wave (surface wave) is irradiated to the metasurface according to the present invention. In FIG. 13: (a) denotes a conventional example; (b) denotes the first embodiment; (c) denotes the second embodiment; and (d) denotes the third embodiment. A black part of each graph in FIG. 13 represents actual concentration of waveforms.

The waveform selectivity also provides a filtering effect that transmits an incident radio wave by changing its waveform. Graph (a) illustrates a transmitted wave in the time domain when a continuous wave is irradiated to the metasurface according to the conventional example. The metasurface according to the conventional example has the characteristics illustrated in FIGS. 25A and 25B. A large absorptance thus corresponds to a small pulse width and a small absorptance corresponds to a large pulse width. The continuous wave is therefore absorbed at an initial state and is transmitted as the time elapses in the time domain. The transmitted wave indicates a waveform made by eliminating the initial energy from the continuous wave.

Graph (b) illustrates a transmitted wave in the time domain when a continuous wave is irradiated to the metasurface according to the first embodiment. The metasurface according to the first embodiment has the characteristics illustrated in FIGS. 8A and 8C. A small absorptance thus corresponds to a small pulse width and a large absorptance corresponds to a large pulse width. The continuous wave is therefore absorbed at an initial state and is transmitted as the time elapses in the time domain. The transmitted wave indicates a waveform that includes only the initial energy.

Graph (c) illustrates a transmitted wave in the time domain when a continuous wave is irradiated to the metasurface according to the second embodiment. The metasurface according to the second embodiment has the characteristics illustrated in FIG. 10A. A large absorptance thus corresponds to a small pulse width and a large pulse width and a small absorptance corresponds to an intermediate pulse width between the large and small pulse widths. The continuous wave is therefore absorbed at an initial state and a state corresponding to the elapsed time and is transmitted at the intermediate time between them in the time domain. The transmitted wave indicates a waveform made by eliminating the initial energy and the energy corresponding to the elapsed time from the continuous wave and leaving only the pulse width corresponding to the intermediate time between them.

Graph (d) illustrates a transmitted wave in the time domain when a continuous wave is irradiated to the metasurface according to the third embodiment. The metasurface according to the third embodiment has the characteristics illustrated in FIG. 12A. A small absorptance thus corresponds to a small pulse width and a large pulse width and a large absorptance corresponds to an intermediate pulse width between the large and small pulse widths. The continuous wave is therefore absorbed at an initial state and a state corresponding to the elapsed time and is transmitted at the intermediate time between them in the time domain. The transmitted wave indicates a waveform made by leaving the initial energy and the energy corresponding to the elapsed time and removing the pulse width corresponding to the intermediate time between them.

As above, the waveform can be transformed so as to be intensely transmitted or absorbed only at a given time and accordingly transmitted or absorbed at the other time domains. Applications of the waveform selectivity may therefore include development of an antenna to oscillate a continuous wave by converting it into a pulse or a receiver to convert an arriving radio wave into a pulse for communication.

The rectifier circuit links two locations of the conductive materials 11 in any of the examples in FIGS. 3A, 3B, and 3C according to the above-mentioned embodiments and modifications. According to the examples in FIGS. 3A and 3C specifically, the rectifier circuit links the adjacent two conductive materials 11 (i.e., two locations) out of a plurality of separated conductive materials 11. According to the example in FIG. 3B, the same rectifier circuit is connected to two locations of the continuous, unseparated conductive materials 11 so that the rectifier circuit links the two locations.

Fourth Embodiment

Figure 14:
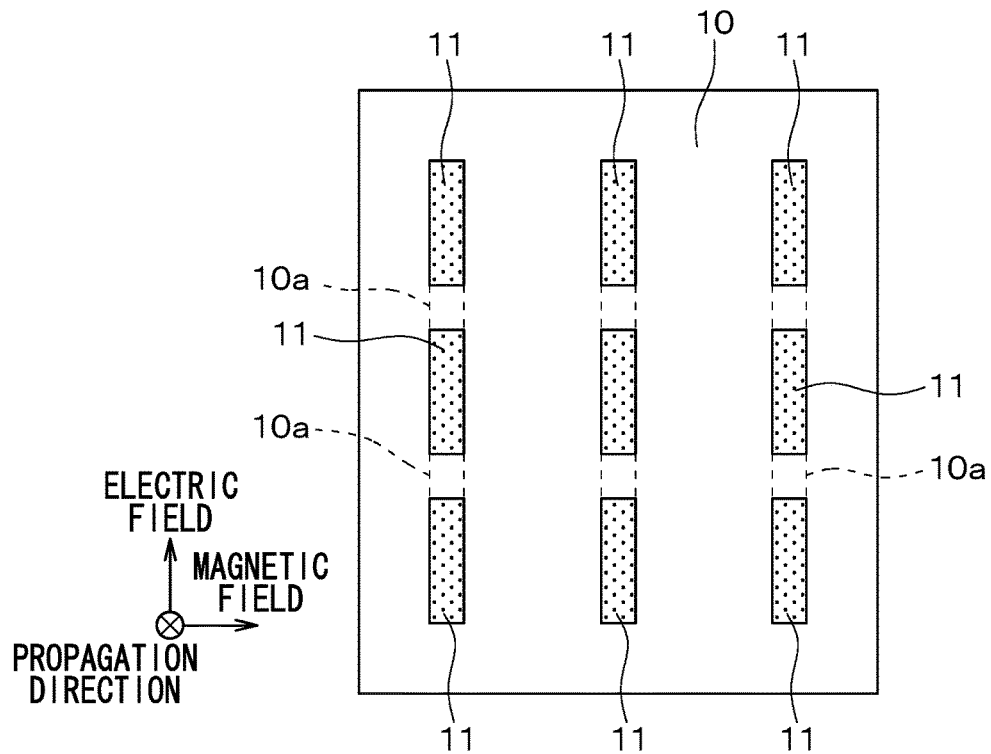
FIG. 14 is a configuration diagram of a waveform selection metasurface according to a fourth embodiment.
Figure 15:
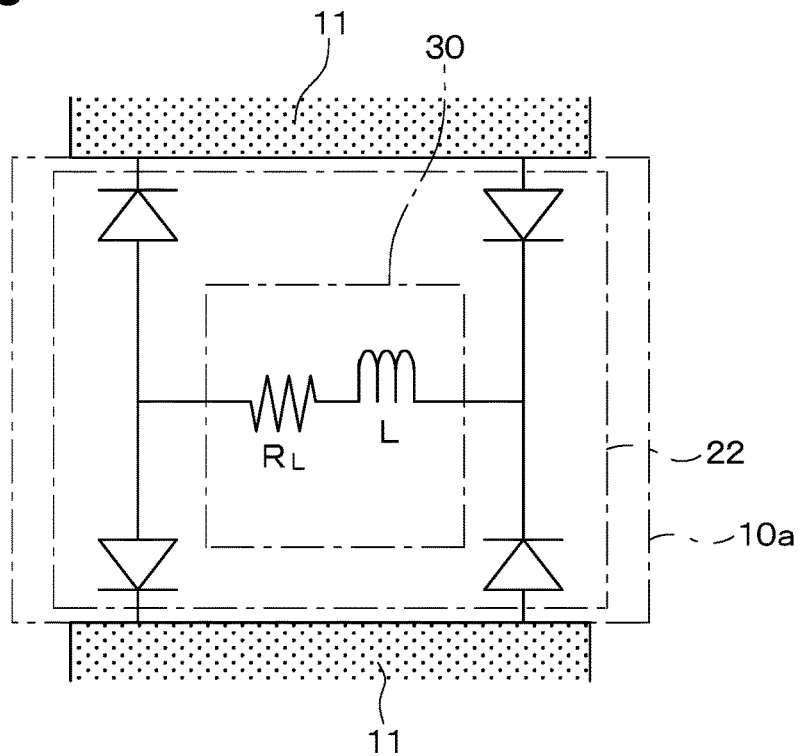
FIG. 15 is a circuit diagram of the waveform selection metasurface according to the fourth embodiment.

The fourth embodiment will be described with reference to FIGS. 14 through 16. As illustrated in FIG. 14, the waveform selection metasurface according to the present embodiment changes each shape of the conductive materials 11 placed in a two-dimensional lattice (i.e., matrix) to a vertically long rectangle compared to the waveform selection metasurface in FIG. 3A according to the first embodiment.

According to the present embodiment, the full-wave rectifier circuit 22 and the RL circuit 30 connected in the full-wave rectifier circuit 22 are placed at a portion 10a of the dielectric substance 10 between the two adjacent conductive materials 11 in a longer direction. As illustrated in FIG. 15, the configuration of the RL circuit 30 is equal to the first through third embodiments.

According to the present embodiment, a radio wave arrives at the waveform selection metasurface and propagates in a direction that is perpendicular to the plane of FIG. 14 and moves away from the plane. An electric field vector of the radio wave is oriented in a vertical direction with reference to the plane. A magnetic field vector is oriented in a horizontal direction with reference to the plane.

Figure 16:
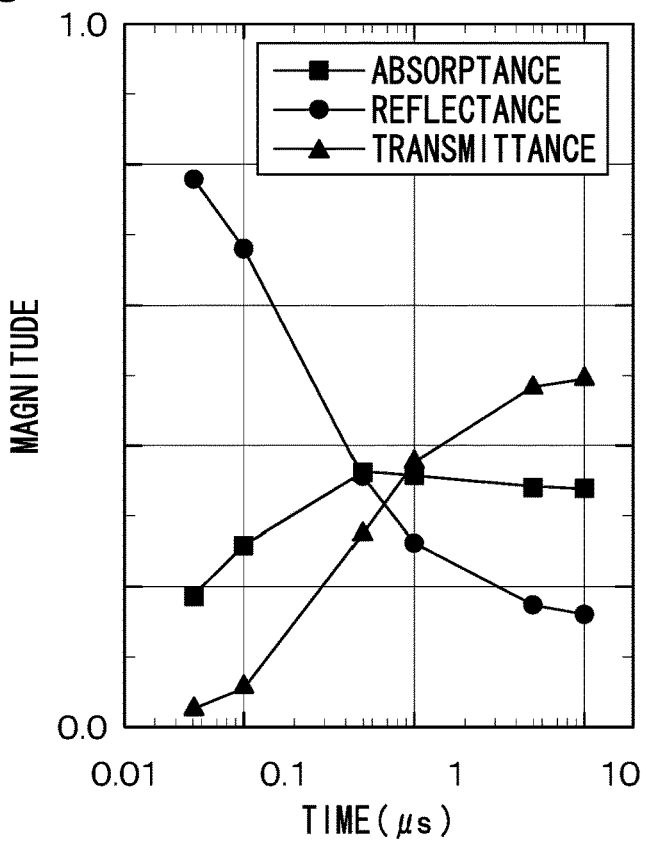
FIG. 16 is a diagram illustrating a transient property of the waveform selection metasurface according to the fourth embodiment.

In this case, FIG. 16 illustrates a result of simulating absorptance, a transmission factor, and reflectance of the radio wave on the waveform selection metasurface. In this simulation, L and $R_L$ correspond to 100 pH and 5.5Ω, respectively.

The simulation according to the present embodiment applies a continuous wave to the waveform selection metasurface to be simulated. The horizontal axis of the graph in FIG. 16 represents the time elapsed from arrival of a continuous wave as the radio wave at the waveform selection metasurface, namely, a time length during which the continuous wave continues to arrive. The vertical axis represents absorptance of the radio wave during a specified period in the past from each elapsed time (specifically, one cycle of the continuous wave). The simulation therefore evaluates a transient property in the time domain, not an averaged absorptance with reference to each pulse width. However, the absorptance with reference to the pulse width is considered to be approximate to the transient property.

According to the simulation, therefore, increasing the pulse width of an arriving radio wave decreases reflectance of the waveform selection metasurface in relation to the radio wave. Increasing the pulse width of the arriving radio wave increases a transmission factor of the waveform selection metasurface in relation to the radio wave. The absorptance of the waveform selection metasurface in relation to the arriving radio wave tends to increase when the pulse width of the radio wave is 0.1 μseconds or more compared to when the pulse width of the radio wave is less than 0.1 μseconds.

The reflectance as well as the absorptance and the transmission factor depends on pulse widths of a radio wave on the waveform selection metasurface according to the present embodiment. Namely, the overall scattering property depends on pulse widths of a radio wave on the waveform selection metasurface.

Fifth Embodiment

Figure 17:
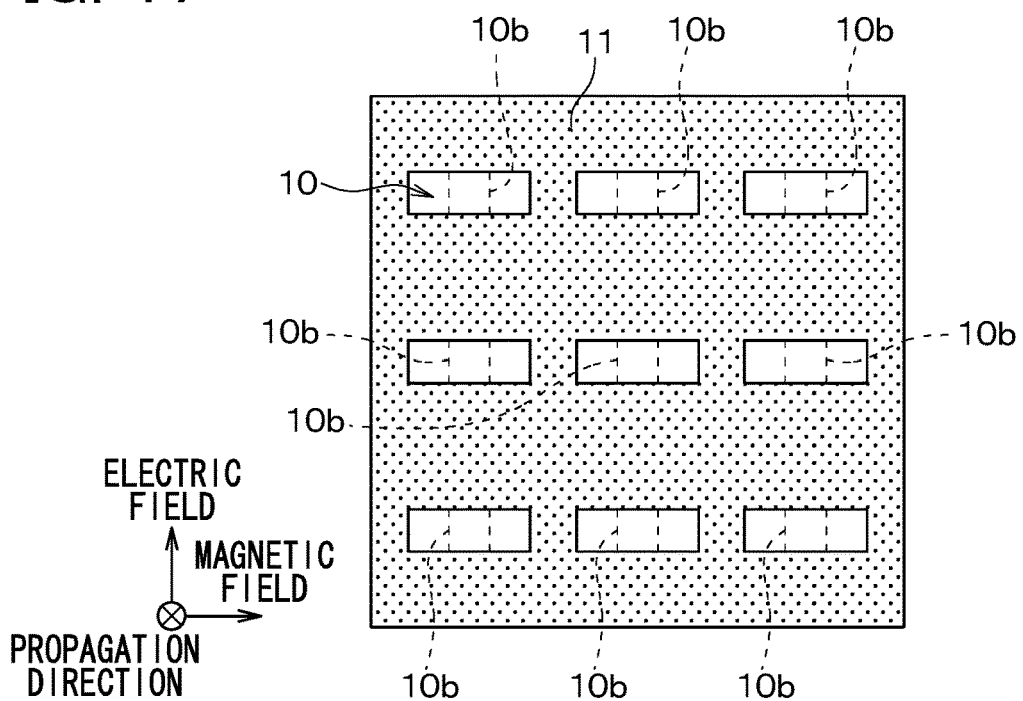
FIG. 17 is a configuration diagram of a waveform selection metasurface according to a fifth embodiment.
Figure 18:
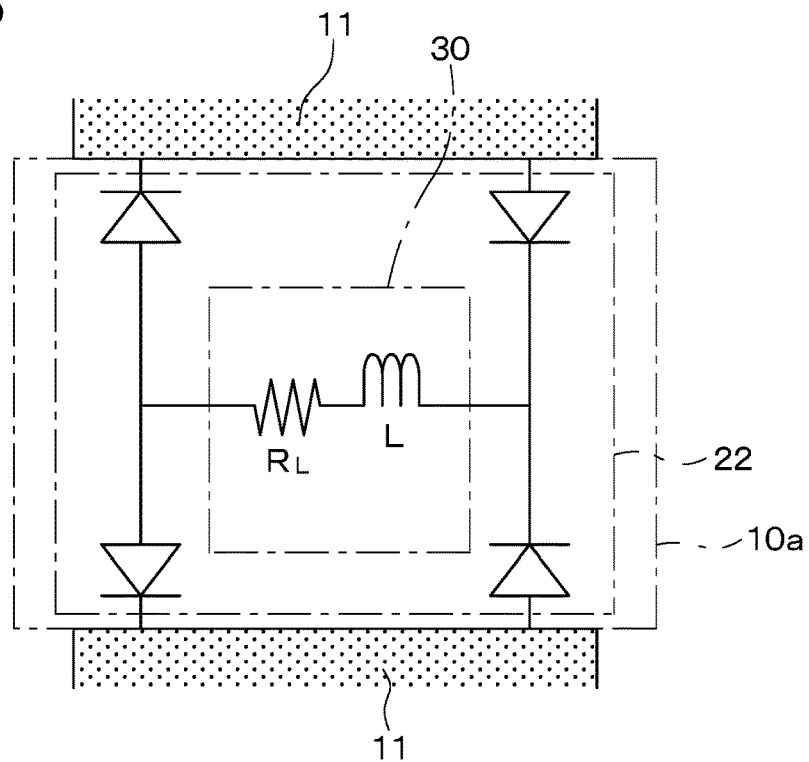
FIG. 18 is a circuit diagram of the waveform selection metasurface according to the fifth embodiment.

The fifth embodiment will be described with reference to FIGS. 17 through 19. As illustrated in FIG. 17, the waveform selection metasurface according to the present embodiment changes the hole shape of the conductive materials 11 placed in a two-dimensional lattice (i.e., matrix) to a horizontally long rectangle compared to the waveform selection metasurface in FIG. 3B according to the first embodiment.

According to the present embodiment, the full-wave rectifier circuit 22 and the RL circuit 30 connected in the full-wave rectifier circuit 22 are placed at a center portion 10b in the longer direction of each of the holes included in the dielectric substance 10. As illustrated in FIG. 18, the configuration of the RL circuit 30 is equal to the first through fourth embodiments.

According to the present embodiment, a radio wave arrives at the waveform selection metasurface and propagates in a direction that is perpendicular to the plane of FIG. 17 and moves away from the plane. An electric field vector of the radio wave is oriented in a vertical direction with reference to the plane. A magnetic field vector is oriented in a horizontal direction with reference to the plane.

The waveform selection metasurface according to the present embodiment is configured to rotate the waveform selection metasurface according to the fourth embodiment by 90° around the radio wave propagation direction as an axis. In addition, the location provided with the conductive materials 11 is replaced by the location devoid of the conductive materials 11.

In this case, the scattering property of the radio wave on the waveform selection metasurface according the present embodiment is equal to an exchange between the reflectance and the transmission factor used for the waveform selection metasurface according to the fourth embodiment.

Figure 19:
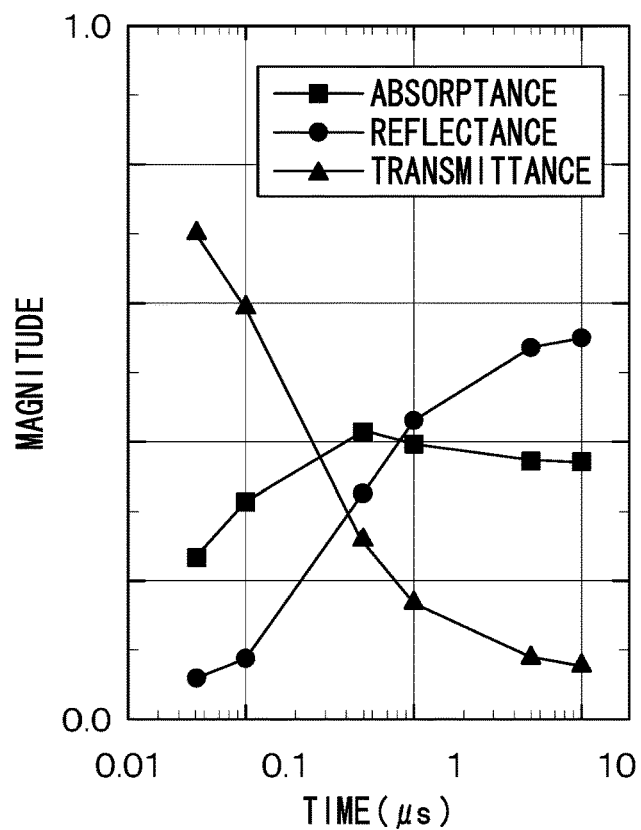
FIG. 19 is a diagram illustrating a transient property of the waveform selection metasurface according to the fifth embodiment.

More specifically, FIG. 19 illustrates a result of simulating absorptance, a transmission factor, and reflectance of the radio wave on the waveform selection metasurface according to the present embodiment. In this simulation, L and $R_L$ correspond to 100 μH and 5.5Ω, respectively. The graph in FIG. 19 is described in the same form as the graph in FIG. 16.

According to the simulation, increasing the pulse width of an arriving radio wave decreases a transmission factor of the waveform selection metasurface in relation to the radio wave. Increasing the pulse width of an arriving radio wave increases reflectance of the waveform selection metasurface in relation to the radio wave. The absorptance of the waveform selection metasurface in relation to the arriving radio wave tends to increase when the pulse width of the radio wave is 0.1 μseconds or more compared to when the pulse width of the radio wave is less than 0.1 μseconds.

The reflectance as well as the absorptance and the transmission factor depends on pulse widths of a radio wave on the waveform selection metasurface according to the present embodiment. Namely, the overall scattering property depends on pulse widths of a radio wave on the waveform selection metasurface.

Sixth Embodiment

Figure 20:
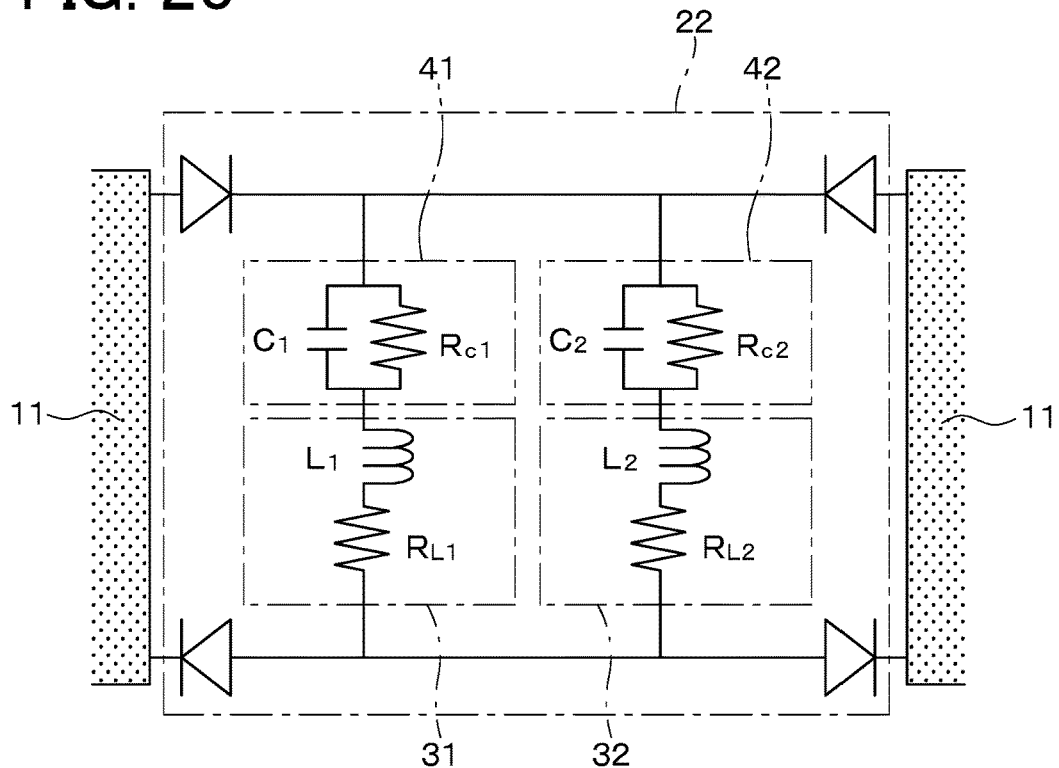
FIG. 20 is a circuit diagram of a waveform selection metasurface according to a sixth embodiment.

The sixth embodiment will be described with reference to FIGS. 20 and 21. The waveform selection metasurface according to the present embodiment modifies the circuit connected in the full-wave rectifier circuit 22 used for the waveform selection metasurface according to the first embodiment illustrated in FIG. 6A.

Specifically, the waveform selection metasurface according to the present embodiment includes a first RL circuit 31, a second RL circuit 32, a first RC circuit 41, and a second RC circuit 42 connected in the full-wave rectifier circuit 22.

Specifically, a circuit including the first RL circuit 31 and the first RC circuit 41 connected in series and a circuit including the second RL circuit 32 and the second RC circuit 42 connected in series are connected to the full-wave rectifier circuit 22 in parallel.

The first RL circuit 31 includes serially connected inductor $L_1$ and resistor $R_{L1}$. The second RL circuit 32 includes serially connected inductor $L_2$ and resistor $R_{L2}$. The first RC circuit 41 includes capacitor $C_1$ and resistor $R_{C1}$ that are connected in parallel. The second RC circuit 42 includes capacitor $C_2$ and resistor $R_{C2}$ that are connected in parallel.

Since two circuits each are connected in parallel and each of the two circuit includes the RL circuit and the RC circuit that are connected in series, a more complicated absorptance than the first through fifth embodiments is provided.

Figure 21:
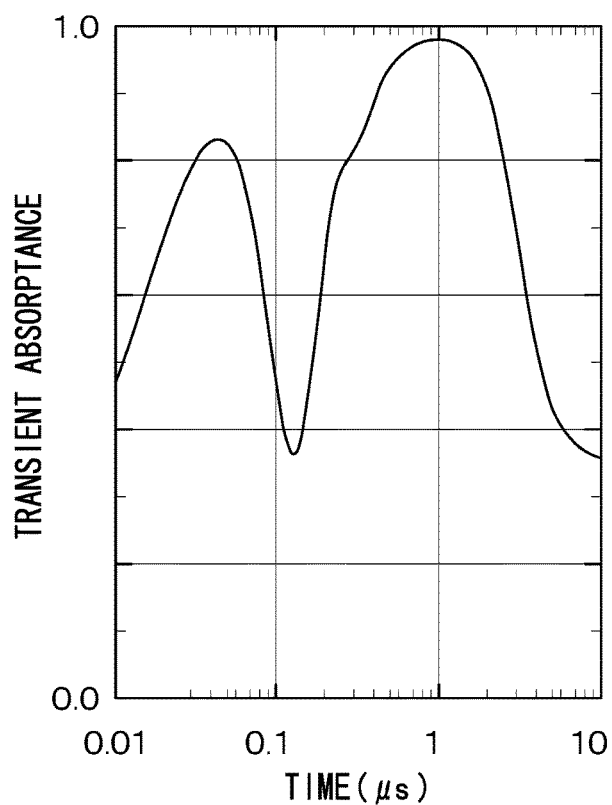
FIG. 21 is a diagram illustrating a transient property of the waveform selection metasurface according to the sixth embodiment.

FIG. 21 illustrates a result of simulating the waveform selection metasurface according to the present embodiment.

The simulation uses $L_1$, $R_{L1}$, $L_2$, $R_{L2}$, $C_1$, $R_{C1}$, $C_2$, and $R_{C2}$ whose values correspond to 30 µH, 10Ω, 300 µH, 10Ω, 30 pF, 10 kΩ, 3 nF, and 10 kΩ, respectively. The other conditions are equal to those of the simulation according to the fourth embodiment. The graph in FIG. 21 uses the same horizontal axis as the graph in FIG. 16.

As illustrated in FIG. 21, the graph of transient absorptances for this waveform selection metasurface shows a curve in which two upwardly convexed curves are arranged in the time direction, wherein each of the two upwardly convexed curves has a shape in which a high transient absorptance occurs at its center in a manner similar to the graph of the absorptance (FIG. 12A) for the waveform selection metasurface in the third embodiment.

Of the two upwardly convexed curves, one represents an increase in the absorptances due to the circuit including the first RL circuit 31 and the first RC circuit 41. The other represents an increase in the absorptances due to the circuit including the second RL circuit 32 and the second RC circuit 42.

A complicated combination of the RC circuit and the RL circuit can complicate the dependence of the absorptance on the pulse width.

Seventh Embodiment

Figure 22:
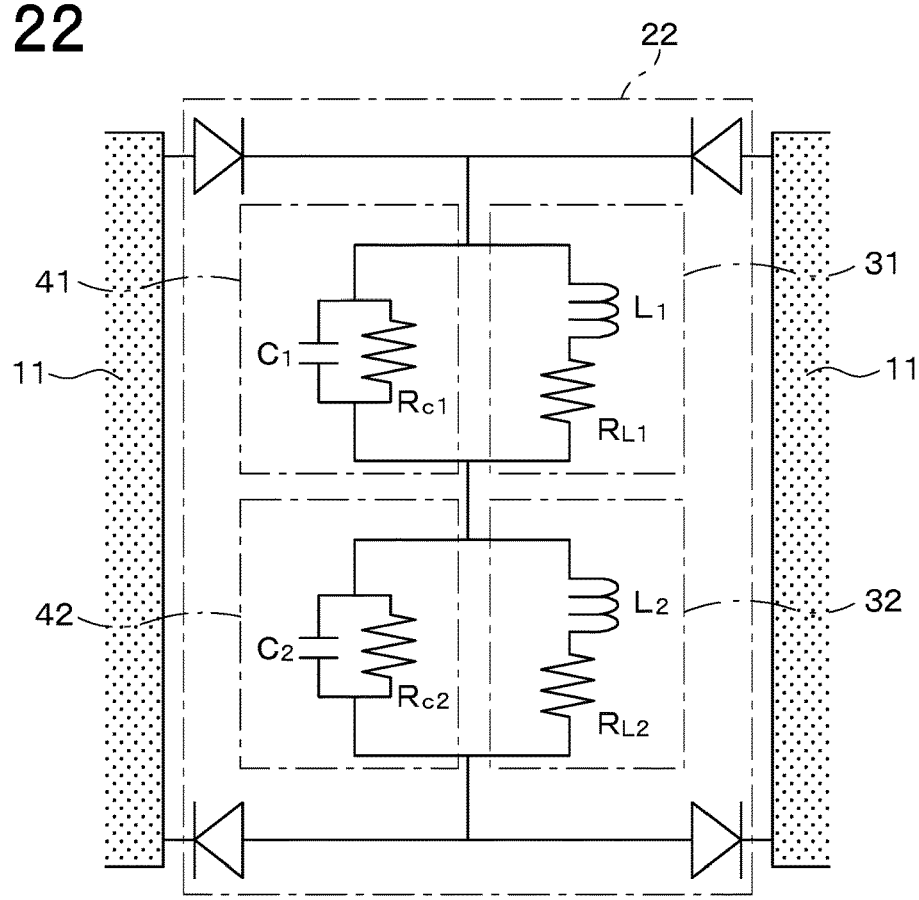
FIG. 22 is a circuit diagram of a waveform selection metasurface according to a seventh embodiment.

The seventh embodiment will be described with reference to FIGS. 22 and 23. The waveform selection metasurface according to the present embodiment modifies the circuit connected in the full-wave rectifier circuit 22 used for the waveform selection metasurface according to the first embodiment illustrated in FIG. 6A.

Specifically, the waveform selection metasurface according to the present embodiment includes the first RL circuit 31, the second RL circuit 32, the first RC circuit 41, and the second RC circuit 42 connected in the full-wave rectifier circuit 22. The internal configurations of the circuits 31, 32, 41, and 42 are equal to those of the sixth embodiment.

Specifically, a circuit including the first RL circuit 31 and the first RC circuit 41 connected in parallel and a circuit including the second RL circuit 32 and the second RC circuit 42 connected in parallel are connected to the full-wave rectifier circuit 22 in series.

The configuration serially places two circuits each of which includes the RL circuit and the RC circuit connected in parallel. The configuration thus provides a more complicated absorptance than the first through fifth embodiments.

Figure 23:
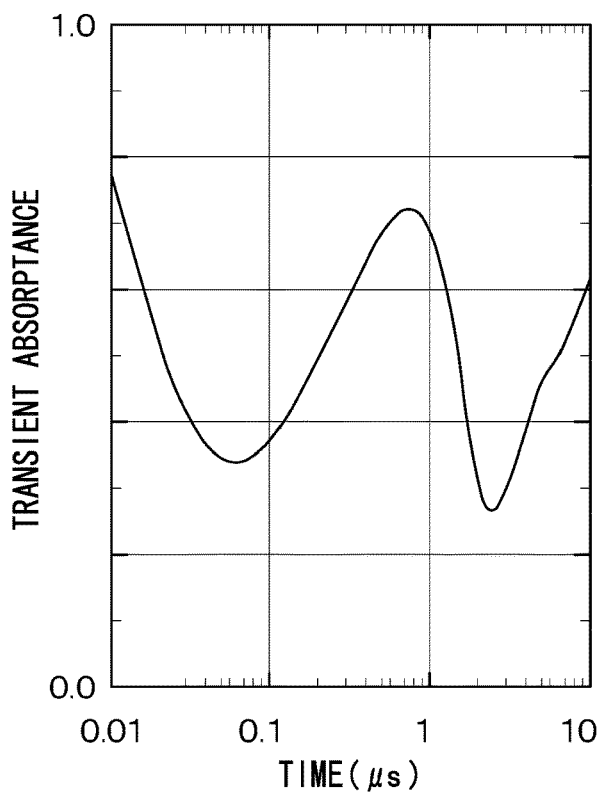
FIG. 23 is a diagram illustrating a transient property of the waveform selection metasurface according to the seventh embodiment.
Figure 24:
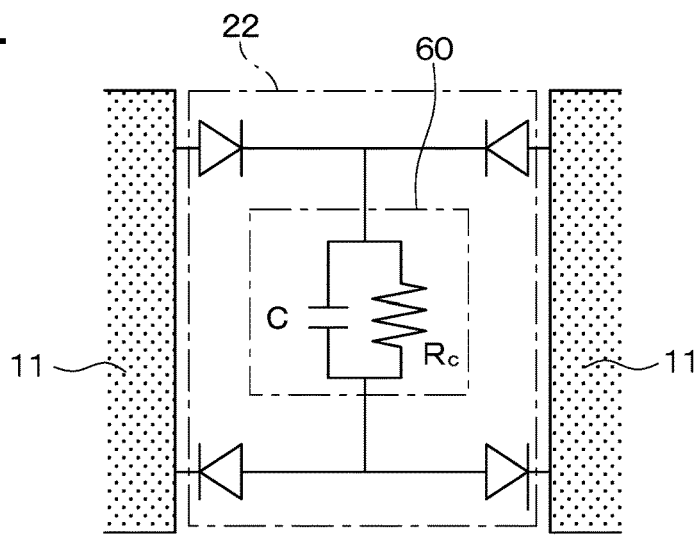
FIG. 24 is a diagram illustrating an RC circuit 60 provided for a full-wave rectifier circuit 22 as a conventional example.

FIG. 23 illustrates a result of simulating the waveform selection metasurface according to the present embodiment. The simulation uses $L_1$, $R_{L1}$, $L_2$, $R_{L2}$, $C_1$, $R_{C1}$, $C_2$, and $R_{C2}$ whose values correspond to 30 µH, 10Ω, 10 mH, 10Ω, 30 pF, 10 kΩ, 1 nF, and 10 kΩ), respectively. The other conditions are equal to those of the simulation according to the sixth embodiment. The graph in FIG. 24 uses the same horizontal axis as the graph in FIG. 21.

The simulation according to the present embodiment applies a continuous wave to the waveform selection metasurface to be simulated. The graph in FIG. 23 is described in the same display form as the graph in FIG. 21.

As illustrated in FIG. 23, the graph of transient absorptances for this waveform selection metasurface shows a curve in which two downwardly convexed curves are arranged in the time direction, wherein each of the two downwardly convexed curves has a shape in which a low transient absorptance occurs at its center in a manner similar to the graph of the absorptance (FIG. 10A) for the waveform selection metasurface in the second embodiment.

Of the two downwardly convexed curves, one represents a decrease in the absorptances due to the circuit including the first RL circuit 31 and the first RC circuit 41. The other represents a decrease in the absorptances due to the circuit including the second RL circuit 32 and the second RC circuit 42.

A complicated combination of the RC circuit and the RL circuit can complicate the dependence of the absorptance on the pulse width.

Other Embodiments

The present invention is not limited to the above-mentioned embodiments. Any combination of modifications described below can be applied to the above-mentioned embodiments.

First Modification

There has been described that the overall scattering property depends on pulse widths of a radio wave on the waveform selection metasurface according to the fourth and fifth embodiments. This also applies to the first through third, sixth, and seventh embodiments. Namely, a variation in the pulse width of an arriving radio wave varies the reflectance of the radio wave also on the waveform selection metasurfaces according to the first through third, sixth, and seventh embodiments.

Second Modification

The first through seventh embodiments may use variable values such as a resistor value of the resistor, a capacitance value of the capacitor, and an inductance value of the inductor. In this case, a variable time constant is also available to the RL circuit and the RC circuit used for the first through seventh embodiments.

Third Modification

The resistor according to the first through seventh embodiments is not limited to a device that functions as an independent resistor. The resistor may be part of a device that includes a resistor component and fulfills the resistor component. For example, a device including the resistor component is available as a MOSFET that generates a resistor component corresponding to a voltage between the drain and the source so that a change in the voltage between the drain and the source varies a drain current.

The capacitor according to the first through seventh embodiments is not limited to a device that functions as an independent capacitor. The capacitor may be part of a device (e.g., variable capacitance diode) that includes a capacitance component and fulfills the capacitance component.

The inductor according to the first through seventh embodiments is not limited to a device that functions as an independent inductor. The inductor may be part of a device that includes an inductor component and fulfills the capacitance component.

Review

As above, all or part of the filters (waveform selection metasurfaces) according to the first through seventh embodiments and the modifications provides the effect of ensuring a higher absorptance in relation to a long pulse width even if a radio wave uses the same frequency. At least part of pulse-width regions can provide characteristics in which increasing the pulse width increases the absorptance.

Varying the time constant for the RL circuit can control the dependence of the absorptance on the pulse width of a radio wave in terms of the effect of ensuring a higher absorptance in relation to a long pulse width even if the radio wave uses the same frequency.

The filter provides the effect of absorbing a short pulse-width signal and a long pulse-width signal and selectively transmitting any intermediate pulse-width signal between the short pulse-width signal and the long pulse-width signal.

The filter provides the effect of transmitting a short pulse-width signal and a long pulse-width signal and selectively absorbing any intermediate pulse-width signal between the short pulse-width signal and the long pulse-width signal.

The filter provides the effect of controlling the dependence of the selective absorptance on pulse widths. Namely, one effect is to absorb a short pulse-width signal and a long pulse-width signal and selectively transmit any intermediate pulse-width signal between the short pulse-width signal and the long pulse-width signal. The other effect is to transmit a short pulse-width signal and a long pulse-width signal and selectively absorb any intermediate pulse-width signal between the short pulse-width signal and the long pulse-width signal. The filter can control the dependence of the absorptance on pulse widths of a radio wave available for these two types of effects.

The filter can be shaped to be flat by separately and periodically placing a plurality of conductive materials. The flat filter can configure an antenna that can efficiently receive radio waves.

As above, the first through third embodiments can provide the waveform selection filter that can absorb a long pulse-width signal and transmit or absorb any intermediate pulse-width signal between a long pulse-width signal and a short pulse-width signal. The present invention can therefore provide an apparatus that selects the same frequency based on waveforms (pulse widths).

The apparatus is available based on the first, second, and third embodiments that differ in characteristics of the absorptance in relation to the pulse width. Applying the apparatus to an antenna can two-dimensionally enhance frequency resources and provide a fundamental solution to the issue of diminishing frequencies in wireless communication technologies.

According to the above-mentioned embodiments, the circuit including the RL circuit 30 and the RC circuit 40 is connected to the full-wave rectifier circuit 22 in series and corresponds to an example of a connection circuit that electrically connects adjacent conductive materials with each other.

INDUSTRIAL APPLICABILITY

The waveform selection metasurfaces according to the above-mentioned embodiments can provide existing wireless communications devices such as antennas or applications with "pulse width" to be used as a new degree of freedom and therefore can increase the possibility of solving the issue of diminishing frequency resources.

The invention claimed is:

1. A filter whose absorptance for a radio wave changes depending on a waveform of a radio wave, the filter comprising:

conductive materials;
a rectifier circuit that links two locations of the conductive materials; and
an RL circuit including an inductor and a resistor, the inductor generating an electromotive force using an electric current rectified by the rectifier circuit and the resistor converting the electric current to heat.

2. A filter whose absorptance for a radio wave changes depending on a waveform of a radio wave, the filter comprising:

conductive materials;
a rectifier circuit that links two locations of the conductive materials; and
an RL circuit that connects an inductor with a resistor in series and allows an electric current rectified by the rectifier circuit to flow.

3. The filter according to claim 1,
wherein, through use of a variable time constant of the RL circuit, it is possible to control dependence of an absorptance on a pulse width of a radio wave.

4. The filter according to claim 1, comprising:
an RC circuit that connects a capacitor with a resistor in parallel,
wherein the RC circuit is connected to the RL circuit in parallel.

5. The filter according to claim 1, comprising:
an RC circuit that connects a capacitor with a resistor in parallel,
wherein the RC circuit is connected to the RL circuit in series.

6. The filter according to claim 4,
wherein, through use of a variable time constant of the RC circuit, it is possible to control dependence of an absorptance on a pulse width of a radio wave.

7. The filter according to claim 1,
wherein the conductive materials are separated into multiple units that are periodically placed.

8. The filter according to claim 1, wherein, in a pulse-width region, the absorptance for the radio wave increases as a pulse width of the radio wave increases.

9. The filter according to claim 2, wherein, in a pulse-width region, the absorptance for the radio wave increases as a pulse width of the radio wave increases.

10. The filter according to claim 2, comprising:
an RC circuit that connects a capacitor with a resistor in parallel,
wherein the RC circuit is connected to the RL circuit in series.

11. The filter according to claim 1, further comprising a dielectric substance, wherein
the conductive materials are separated and periodically placed on a surface of the dielectric substance,
a non-periodic metal plate is not placed on another surface of the dielectric substance, and
in a pulse-width region, reflectance for the radio wave decreases as a pulse width of the radio wave increases.

12. The filter according to claim 2, further comprising a dielectric substance, wherein
the conductive materials are separated and periodically placed on a surface of the dielectric substance,
a non-periodic metal plate is not placed on another surface of the dielectric substance, and
in a pulse-width region, reflectance for the radio wave decreases as a pulse width of the radio wave increases.

13. The filter according to claim 1, further comprising a dielectric substance, wherein the conductive materials have, as a single conductive material, a periodical structure having a plurality of holes, a non-periodic metal plate is not placed on another surface of the dielectric substance, and in a pulse-width region, transmittance for the radio wave decreases as a pulse width of the radio wave increases.

14. The filter according to claim 2, further comprising a dielectric substance, wherein the conductive materials have, as a single conductive material, a periodical structure having a plurality of holes, a non-periodic metal plate is not placed on another surface of the dielectric substance, and in a pulse-width region, transmittance for the radio wave decreases as a pulse width of the radio wave increases.

\* \* \* \* \*